United States Patent [19]

Watanabe et al.

[11] Patent Number: 4,931,163

[45] Date of Patent: Jun. 5, 1990

[54] PITCH FLUORIDE

[75] Inventors: Nobuatsu Watanabe, Nagaokakyo; Hidekazu Tohara, Nagano; Yuji Matsumura, Nishinomiya; Hiroyuki Fujimoto, Osaka, all of Japan

[73] Assignee: Osaka Gas Co, Ltd., Osaka, Japan

[21] Appl. No.: 198,533

[22] Filed: May 25, 1988

Related U.S. Application Data

[63] Continuation-in-part of Ser. No. 916,073, Oct. 6, 1986, abandoned.

[30] Foreign Application Priority Data

Oct. 4, 1985 [JP] Japan ................................. 60-221440

[51] Int. Cl.$^5$ ............................................. C10C 1/00
[52] U.S. Cl. ...................................... 208/44; 208/22; 208/40; 570/130; 570/150; 428/421; 106/284; 106/284.2; 423/448; 423/449
[58] Field of Search ............................. 208/44, 39, 22; 570/130, 150; 423/449, 448; 106/284, 284.2; 428/421

[56] References Cited

U.S. PATENT DOCUMENTS

| | | | |
|---|---|---|---|
| Re. 30,667 | 7/1981 | Watanabe et al. | 252/1 |
| 2,186,916 | 1/1940 | Wiezevich | 200/18 |
| 2,287,511 | 6/1942 | Burk et al. | 208/44 |
| 3,373,101 | 3/1968 | Folians | 208/40 |
| 3,536,532 | 10/1970 | Watanabe | 136/83 |
| 3,775,489 | 11/1973 | Margrave et al. | 570/130 |
| 3,929,918 | 12/1975 | Meshri et al. | 570/150 |
| 4,005,183 | 1/1977 | Singer | 423/447.4 |
| 4,014,725 | 3/1977 | Schulz | 156/148 |
| 4,111,794 | 9/1978 | Pelzku et al. | 423/448 |
| 4,243,615 | 1/1981 | Watanabe et al. | 570/150 |
| 4,356,158 | 10/1982 | Ishikawa et al. | 423/447.4 |
| 4,386,137 | 5/1983 | Watanabe et al. | 428/457 |
| 4,447,663 | 5/1984 | Akiyama et al. | 570/150 |
| 4,693,928 | 9/1987 | Foss | 428/421 |
| 4,789,455 | 12/1988 | Mochida et al. | 208/34 |

FOREIGN PATENT DOCUMENTS 0119595 9/1984 European Pat. Off. .
0176110 10/1983 Japan .
572425 9/1977 U.S.S.R. .

OTHER PUBLICATIONS

"Chemical Composition and Crystal Structure of Graphitefluoride"; Journal Am. Chem. Soc. 101:147-7-4-79, Kita et al.
Structure of Anisotropic Spheres Obtained in the Course of Needle Coke Formation, Mochido et al., Res. Inst. of Indus. Science, 6-30-76, Kyneston University, Japan.
Bulletin Chem. Soc. Japan 57, 701-705 (1984) published Mar. 1984.
Pre-Lecture Abstract for the Lecture, "Reaction of Fromation . . . of Pitch", Tokyo, Dec. 11-13, 1985.
Pre-Lecture Abstract for the Lecture, "Thin Film Formation . . . Physical Properties", Paris, France, Aug. 25-29, 1986.
"Method Harnesses Direct Fluorination", C&EN, Jan. 12, 1970.
"Structure of Anisotropic . . . Needle Coke Formation", CAR vol. 15, pp. 17-23, Jun. 30, 1976.

Primary Examiner—Helane Myers
Attorney, Agent, or Firm—Sprung Horn Kramer & Woods

[57] ABSTRACT

A carbon fluoride comprising carbon atoms and fluorine atoms and having a structure in which layers containing fluorinated condensed cyclohexane rings are stacked to form a packing structure, the atomic ratio of fluorine to carbon atoms being 0.5 to 1.8, the carbon fluoride exhibiting a powder X-ray diffraction pattern in which there are peaks respectively at about 13° (2θ) and at about 40° (2θ) and no peak on the low side of diffraction angle relative to 13° (2θ) and exhibiting a spectrum of electron spectroscopy for chemical analysis in which there are peaks respectively due to a monofluorocarbon group and due to a difluorocarbon group, the intensity ratio of the peak due to the difluorocarbon group to the peak due to the monofluorocarbon group being 0.15 to 1.5. The carbon fluoride has a unique property that it is capable of forming a film by vacuum deposition. The carbon fluoride may be produced by the direct fluorination of a pitch or meso-carbon microbeads.

9 Claims, 24 Drawing Sheets

WAVE NUMBER(cm⁻¹)

WAVE NUMBER(cm⁻¹)

WAVE NUMBER(cm⁻¹)

WAVE NUMBER(cm⁻¹)

PITCH FLUORIDE

This application is a continuation-in-part of copending U.S. patent application Ser. No. 916,073 filed on Oct. 6, 1986 now abandoned.

BACKGROUND OF THE INVENTION

1. Field of the Invention

This invention relates to a pitch fluoride and a process for preparing the same. More particularly, the present invention is concerned with a pitch fluoride, which is a novel carbon fluoride having various excellent properties comparable or superior to those of conventionally known graphite fluorides. This invention is also concerned with a novel solid fluoro compound which is produced by the thermal decomposition of a pitch fluoride and which not only has various excellent properties comparable or superior to those of conventionally known graphite fluorides but also is capable of forming a film by vacuum deposition. The present invention is further concerned with a novel film having excellent properties which can be produced from the above-mentioned pitch fluoride or solid fluoro compound.

2. Discussion Of Related Art

Recently, a graphite fluoride prepared by the direct fluorination of a carbon material having a relatively well developed graphite structure, such as natural graphite or heat-treated coke, has been drawing attention as a new industrial material because of its unique properties. For example, poly-monocarbon monofluoride represented by the formula $(CF)_n$ is well known as one of the graphite fluorides. $(CF)_n$ is a solid powder material having excellent lubricating and water- and oil-repellent properties as well as excellent chemical resistance. Therefore, $(CF)_n$ has been used as a solid lubricant, and also used as anti-wetting, stain-resistant and water- and oil-repellent materials. Further, $(CF)_n$ has been used as an active material capable of providing a primary cell of high energy density and long shelf life in which voltage drop due to discharge is scarcely observed for a long period of time as disclosed in U.S. Pat. No. 3,536,532.

Poly-dicarbon monofluoride represented by the formula $(C_2F)_n$ which was found by Watanabe et al. has almost the same properties as $(CF)_n$, and is highly appreciated in a wide variety of industrial fields (see, for example, U.S. reissued Pat. No. Re 30,667).

However, both of the above-mentioned graphite fluorides, i.e. $(CF)_n$ and $(C_2F)_n$, have problems with respect to the production thereof. Specifically, the thermal decomposition temperature of $(CF)_n$ is extremely close to the temperature employed for the formation of the $(CF)_n$. In general, the temperature difference between the formation temperature of $(CF)_n$ and the decomposition temperature is only about 10 to about 50° C. and, therefore, strict control of the reaction temperature is required. Moreover, since both the formation reaction and decomposition reaction of $(CF)_n$ are exothermic, the temperature control is so difficult that the formation reaction and decomposition reaction tend to occur at the same time, and this prevents $(CF)_n$ from being stably produced in high yield. Therefore, for the purpose of improving the yield of $(CF)_n$, it has been attempted to effect the fluorination reaction in multiple steps. This makes the manufacturing process complicated and unpractical. Further, when $(CF)_n$ is produced using a natural graphite or an artificial graphite as a starting material, it is necessary to react the graphite with fluorine, which is a highly corrosive gas, at a temperature as high as about 500° to 630° C. and, therefore, a reaction vessel to be used in the reaction must be made of an expensive material, such as nickel, and this also makes the process uneconomical.

With respect to the formation of poly-dicarbon monofluoride $(C_2F)_n$, although the reaction temperature is lower than that for forming $(CF)_n$, it is still necessary to conduct the reaction at relatively high temperatures, namely, 300° to 500° C., so that the use of a reaction vessel of an expensive material, such as nickel, is needed as in the case of formation of $(CF)_n$. Further, in the formation of $(C_2F)_n$, the use of highly crystallized graphite material is required. For example, in the case where petroleum cokes are employed, they must be used after heat-treated for enhancing crystallinity thereof. In addition to the above-mentioned drawbacks, $(C_2F)_n$ has such a disadvantage that the reaction time required for the production thereof is long.

SUMMARY OF THE INVENTION

The present inventors have made extensive and intensive studies with a view to developing a novel fluoro compound which can be easily produced in high yield even under mild reaction conditions as compared to those for the production of $(CF)_n$ and $(C_2F)_n$ and which has excellent properties comparable or superior to those of $(CF)_n$ and $(C_2F)_n$. As a result, the present inventors have unexpectedly, surprisingly found that when a pitch is reacted with fluorine, the fluorination reaction proceeds even at room temperature and that the resulting solid pitch fluoride is not only comparable to $(CF)_n$ or $(C_2F)_n$ in properties, such as water- and oil-repellencies but also has unique properties which are not found in $(CF)_n$ or $(C_2F)_n$. The present invention has been made based on such novel findings.

Accordingly, an object of the present invention is to provide a novel pitch fluoride which has not only properties comparable to those of $(CF)_n$ and $(C_2F)_n$ but also other excellent unique properties not found in $(CF)_n$ and $(C_2F)_n$.

Another object of the present invention is to provide a process for preparing a pitch fluoride in high yield.

A further object of the present invention is to provide a novel solid fluoro compound which is produced by the thermal decomposition of a pitch fluoride and which not only has various excellent properties comparable or superior to those of conventionally known graphite fluorides but also is capable of forming a film by vacuum deposition.

Still a further object of the present invention is to provide a novel film having excellent properties which can be produced either from the above-mentioned pitch fluoride or from the above-mentioned solid fluoro compound.

The foregoing and other objects, features and advantages of the present invention will be apparent to those skilled in the art from the following detailed description taken in connection with the accompanying drawings.

Actually the pitch fluoride of the present invention is more correctly identified as a carbon fluoride. However, the novel carbon fluoride may be obtained by the direct fluorination of a pitch and, therefore, is herein often referred to as "pitch fluoride".

Figure 1:
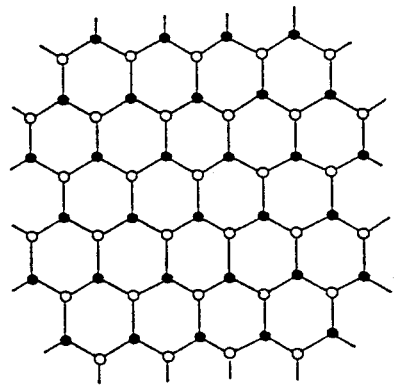
FIG. 1(A) is a diagram of the layer structure of a condensed ring of a pitch fluoride according to the present invention.
FIG. 1(B) is a diagrammatic view illustrating the structure of crosslinking of the fluorinated condensed cyclohexane rings through perfluorocarbon residues in the pitch fluoride of the present invention.
Figure 1:
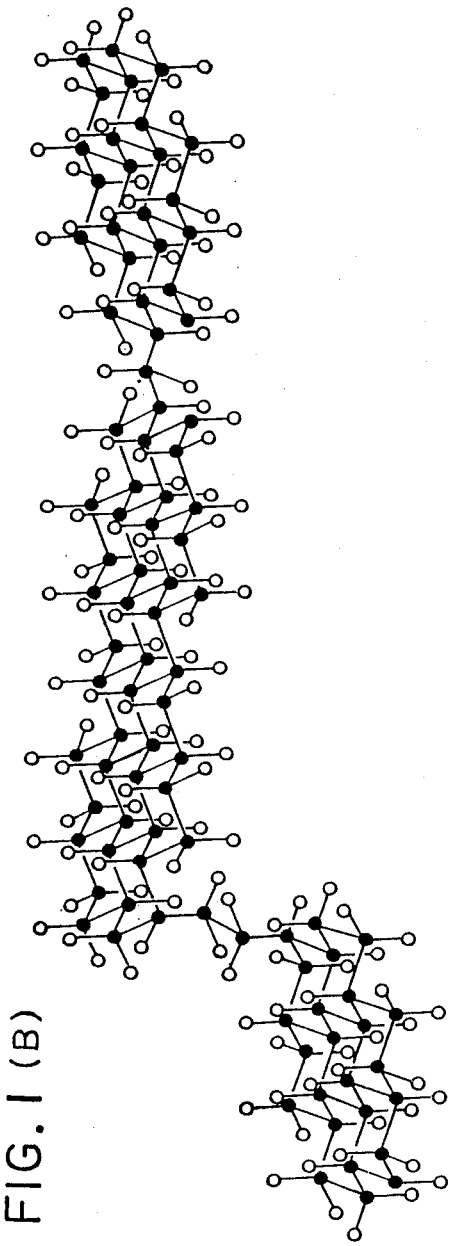

Essentially, according to the present invention, there is provided a carbon fluoride comprising carbon atoms and fluorine atoms and having a structure in which layers containing fluorinated condensed cyclohexane rings are stacked to form a packing structure, the atomic ratio of fluorine to carbon atoms being 0.5 to 1.8, the carbon fluoride exhibiting:

(a) in the powder X-ray diffraction pattern, a peak having a maximum intensity at about 13° ($2\theta$), a peak at about 40° ($2\theta$) having an intensity lower than that of the peak appearing at about 13° ($2\theta$) and no peak on the low side of diffraction angle relative to 13° ($2\theta$);

(b) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;

(c) a property that it is capable of forming a film by vacuum deposition; and (d) a contact angle of 141°±8° against water as measured at a temperature of 30° C.

With respect to a pitch, it is known that a pitch has a layer structure in which layers containing planar aromatic condensed rings are stacked to form a packing structure. The planar aromatic condensed rings are believed to be crosslinked by an aliphatic hydrocarbon residue, such as methylene [Carbon, Vol. 15, 17(1977)]. In this literature, the layer structure of a planar aromatic condensed ring is confirmed by the following method. The quinoline insoluble contents [QI] of a pitch are observed by means of a high resolution electron microscope to confirm the layer structure of the planar aromatic condensed ring. Further, through the observations using a high resolution electron microscope etc., it is found that the sizes of the planar molecules are about 6 to 15 Å, which correspond to condensed ring compounds having a molecular weight of 150 to 800 or more. On the other hand, the molecular weight is also determined by the solvent extraction method and found to be 400 to 3,000 or more. From these facts, the author of the literature concludes that relatively small condensed ring compounds are crosslinked by methylene to form higher molecular weight compounds. Further confirmation of the presence of a methylene group by H-NMR analysis and $C^{13}$-NMR analysis is still in progress. The term "pitch" as used in the present invention is intended to mean those having the above-mentioned structure. Examples of pitches include products obtained by subjecting petroleum heavy oil or coal heavy oil, such as a still residue of petroleum distillation, thermal decomposition residue of naphtha, ethylene bottoms, liquefied coal and coal tar, to distillation to remove low boiling components having boiling points lower than 200° C., and products obtained by subjecting the above-obtained low boiling components-free products to further treatment, such as heat treatment and/or hydrogenation. Examples of pitches also include products obtained by subjecting petroleum heavy oil or coal heavy oil to treatment such as heat treatment and/or hydrogenation and subjecting the treated oil to distillation to remove low boiling components having boiling points lower then 200° C. As representative examples of pitches, there may be mentioned an isotropic pitch, a mesophase pitch, a hydrogenated mesophase pitch, etc. Further, in the present invention, meso-carbon microbeads can also be employed as a raw material for producing a pitch fluoride of the present invention. Mesocarbon microbeads can be obtained by distilling a petroleum heavy oil or coal heavy oil to remove low boiling components, subjecting the resulting residue to heat treatment to form mesophase spheres and collecting the mesophase spheres. Both the pitches and meso-carbon microbeads are hereinafter often referred to simply as "pitch". It has been established in the art that a pitch or meso-carbon microbeads are different from a coke or graphite in that the pitch or meso-carbon microbeads have an atomic ratio of carbon to hydrogen atoms (C/H ratio) or 2.5 or less whereas the coke or graphite has a C/H ratio of 8 or more.

The pitch fluoride of the present invention is a novel compound, and it has a layer structure derived from a pitch.

With respect to the characteristic features of the pitch fluoride of the present invention, an explanation will be given below.

In FIGS. 1(A) and 1(B), there is shown an ideal structure of a pitch fluoride of the present invention which has been completely fluorinated.

Referring now to FIG. 1(A), there is illustrated a diagram showing an ideal layer structure of a fluorinated condensed ring of a pitch fluoride according to the present invention, with the filled and vacant circles respectively representing fluorine atoms bonding above and below the carbon ring network. The structure of the condensed ring seems to be identical to that of $(CF)_n$. However, $(CF)_n$ is wholly composed of such a structure, whereas the pitch fluoride of the present invention has a layer structure in which the fluorinated condensed cyclohexane rings having the structure schematically shown in FIG. 1(A) are believed to be crosslinked by perfluorocarbon residues which are formed by the substitution of fluorine atoms for the hydrogen atoms of the aliphatic hydrocarbon residues crosslinking the aromatic condensed rings in a pitch. The layer structure of the pitch fluoride is schematically illustrated in FIG. 1(B) in which the filled and vacant circles represent a carbon atom and a fluorine atom, respectively. The structure of the condensed ring in the pitch fluoride according to the present invention may be confirmed by the method as described in the above-mentioned "Carbon" vol. 15, 17 (1977), using a high resolution electron microscope. Further, the structure of the cross-linking of the condensed rings by perfluorocarbon residues may be confirmed by X-ray diffractometry, electron spectroscopy for chemical analysis ($C_{1s}$ ESCA spectrum) and $C^{13}$-NMR. In the pitch fluoride of the present invention, the layers containing the above-mentioned fluorinated condensed rings are stacked with interlayer spacings to form a packing structure.

Figure 2:
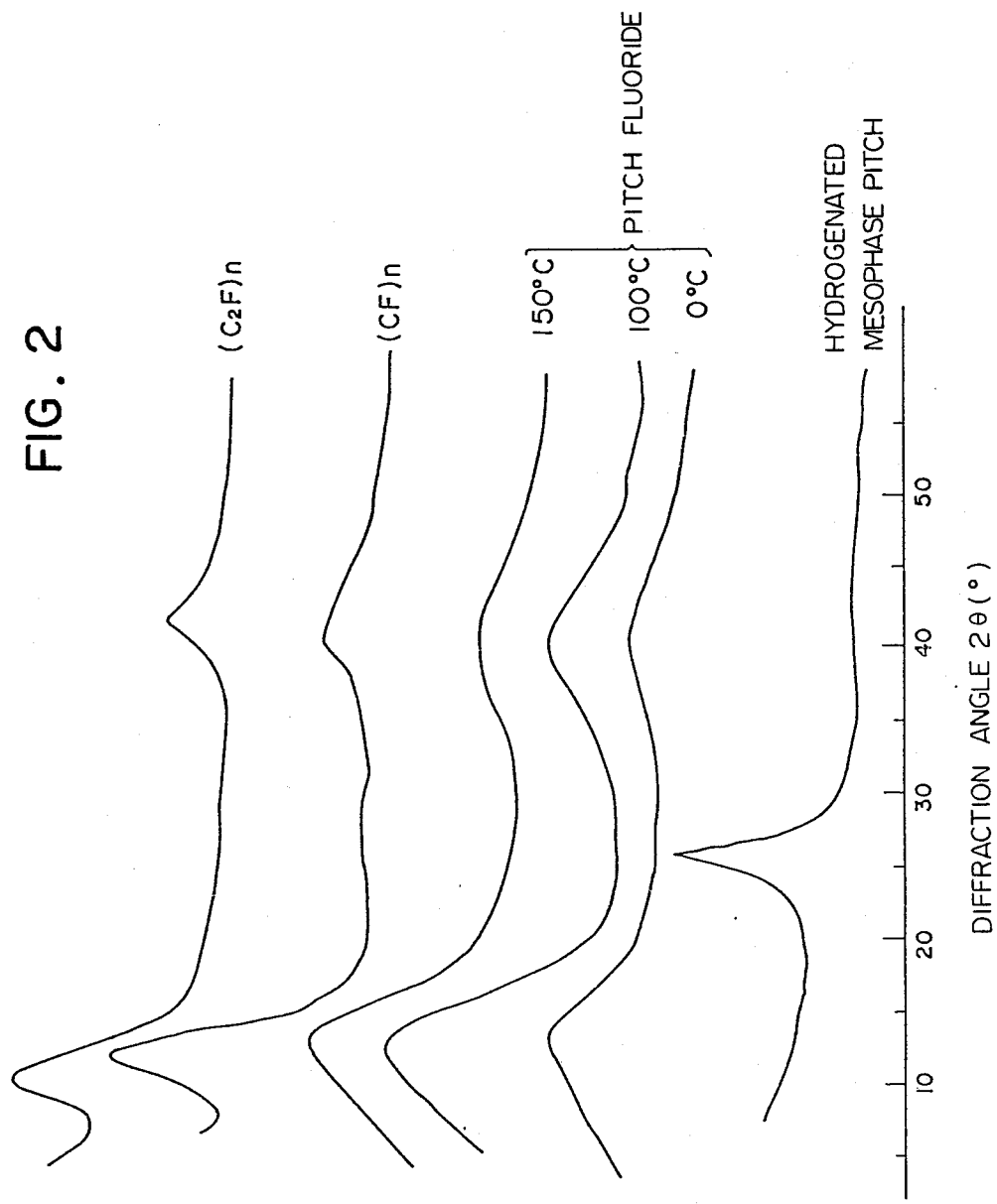
FIG. 2 shows the X-ray diffraction patterns of pitch fluorides of the present invention which have been prepared using a hydrogenated mesophase pitch as a raw material under various reaction temperatures, in comparison with the X-ray diffraction patterns of the hydrogenated mesophase pitch and those of graphite fluorides of the formulae $(CF)_n$ and $(C_2F)_n$.
Figure 3:
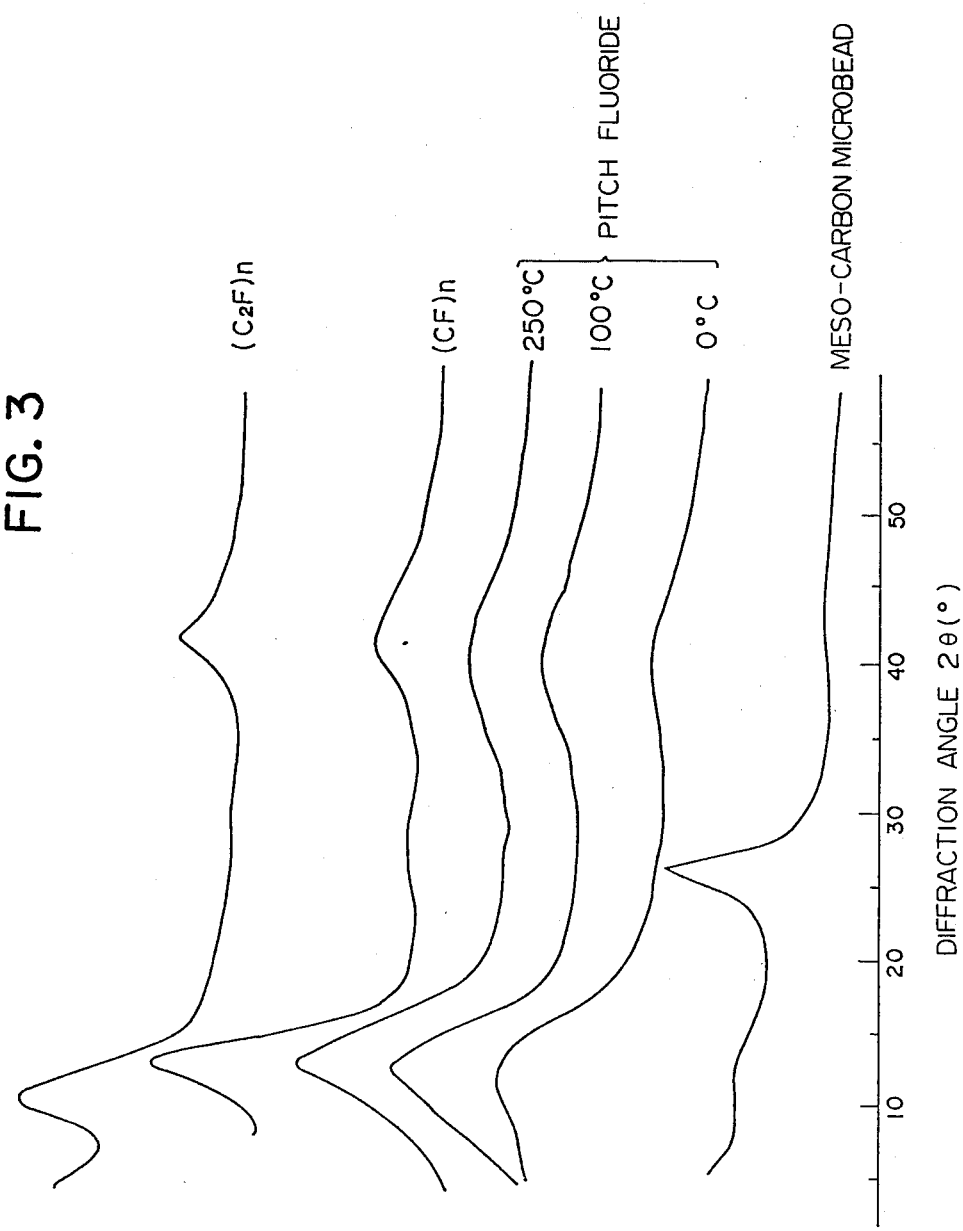
FIG. 3 shows the X-ray diffraction patterns of pitch fluorides which have been prepared using meso-carbon microbeads as a raw material under various reaction temperatures, in comparison with the X-ray diffraction patterns of the meso-carbon microbeads and those of graphite fluorides of the formulae $(CF)_n$ and $(C_2F)_n$.

In FIG. 2 there are shown X-ray diffraction patterns of the pitch fluorides according to the present invention which have been prepared using a hydrogenated mesophase pitch as a raw material under various reaction temperatures, in comparison with the X-ray diffraction pattern of the hydrogenated mesophase pitch and those of graphite fluorides of the formulae $(CF)_n$ and $(C_2F)_n$ [both manufactured and sold by Central Glass Co., Ltd., Japan]. In FIG. 3, there are shown X-ray diffraction patterns of the pitch fluorides which have been prepared using meso-carbon microbeads as raw material under various reaction temperatures, in comparison with the X-ray diffraction pattern of the meso-carbon microbeads and those of graphite fluorides of the formulae $(CF)_n$ and $(C_2F)_n$ [both manufactured and sold by Central Glass Co., Ltd, Japan]. As is apparent from FIGS. 2 and 3, the pitch fluoride according to the present invention has a peak having a maximum intensity at about 13° ($2\theta$) and a peak at about 40° ($2\theta$) having an intensity lower than that of the peak appearing at about 13° ($2\theta$). In addition, as shown in FIGS. 2 and 3, there is no peak on the low side of diffraction angle relative to 13° ($2\theta$) at which the peak having the maximum intensity appears. The interlayer spacing of the layer structure in the pitch fluoride is $6.8 \pm 1.0$ Å, and the X-ray diffraction pattern of the pitch fluoride is similar to that of $(CF)_n$ which is a lamellar compound having an interlayer spacing of about 7.5 Å. However, as shown in FIGS. 2 and 3, the peaks exhibited by the pitch fluoride are broad as compared to those of $(CF)_n$ and $(C_2F)_n$. This suggests that the crystalline structure of the pitch fluoride is disarrayed due to the presence of crosslinkages of perfluorocarbon.

Figure 4:
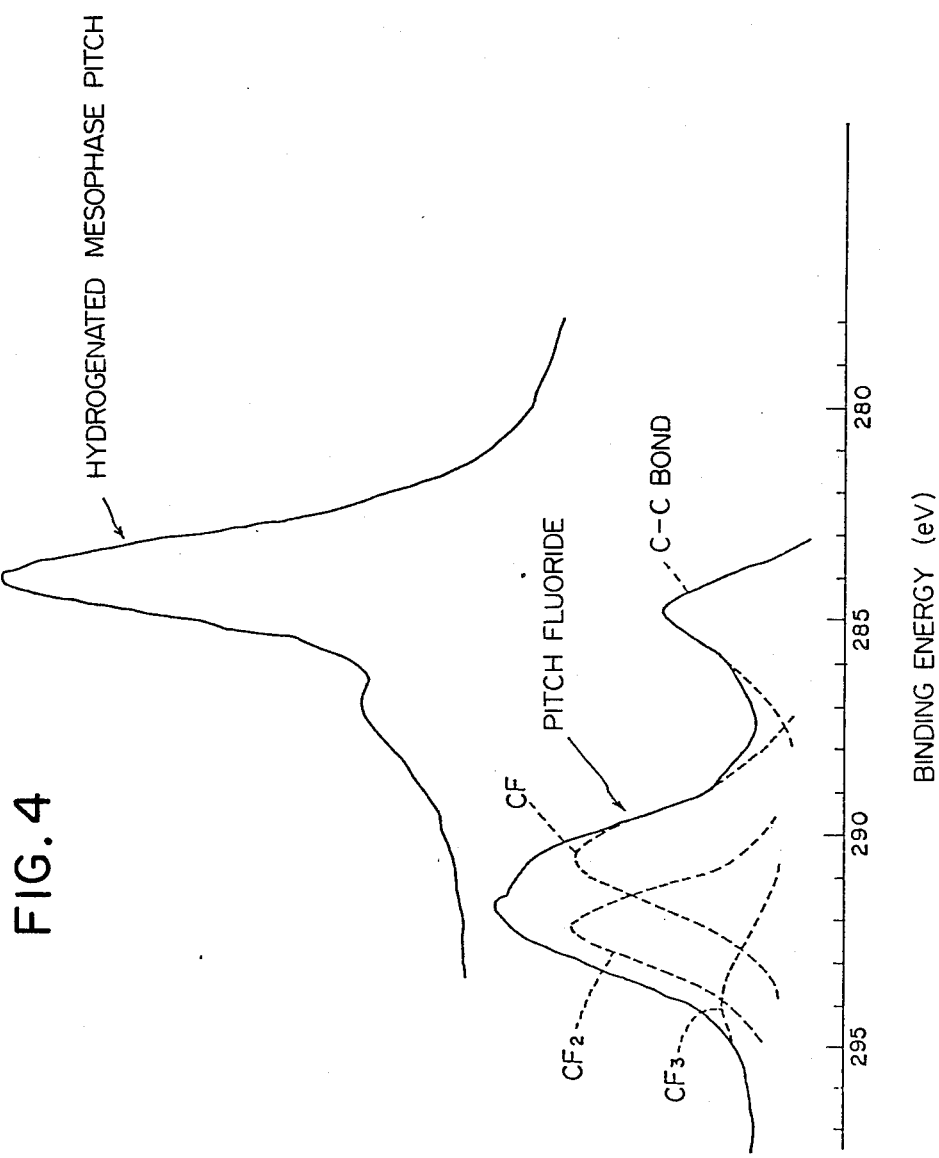
FIG. 4 shows the ESCA (electron spectroscopy for chemical analysis) spectrum of a pitch fluoride of the present invention which has been prepared using a hydrogenated mesophase pitch, in comparison with the ESCA spectrum of the hydrogenated mesophase pitch.
Figure 5:
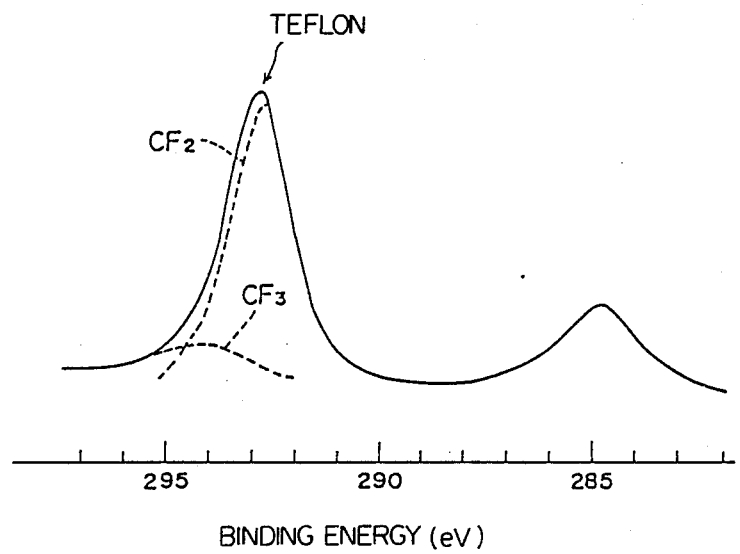
FIGS. 5, 6 and 7 show the ESCA spectra of Teflon, $(CF)_n$ and $(C_2F)_n$, respectively.
Figure 6:
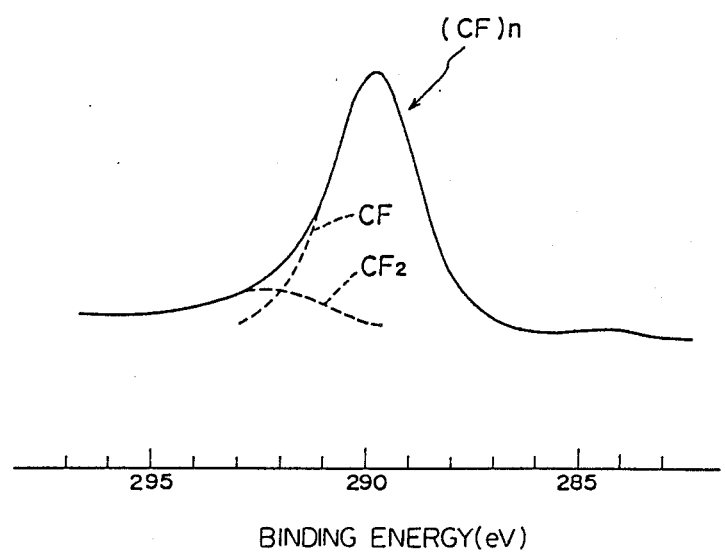
Figure 7:
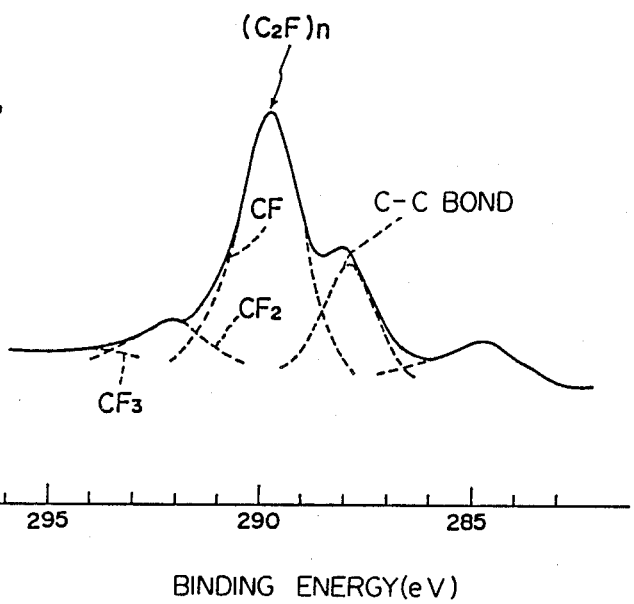
Figure 8:
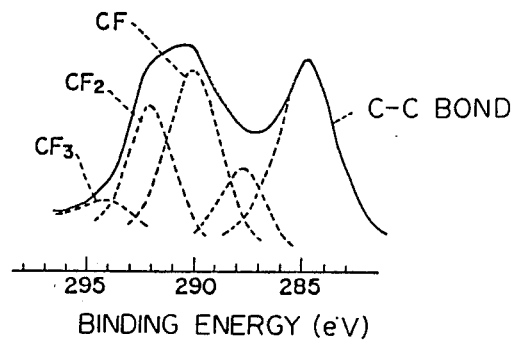
FIGS. 8, 9 and 10 respectively show the ESCA spectra of the pitch fluorides according to the present invention which have been prepared in Examples 1, 5 and 6 as will be mentioned later.
Figure 9:
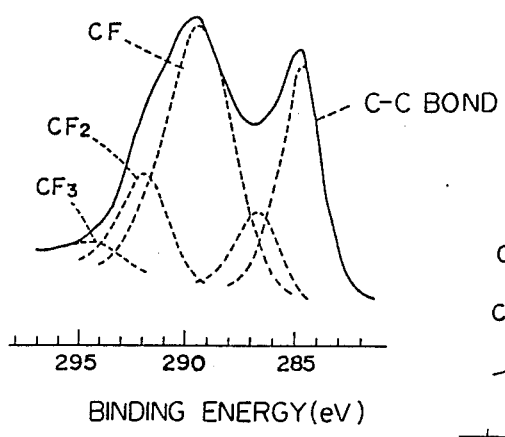
Figure 10:
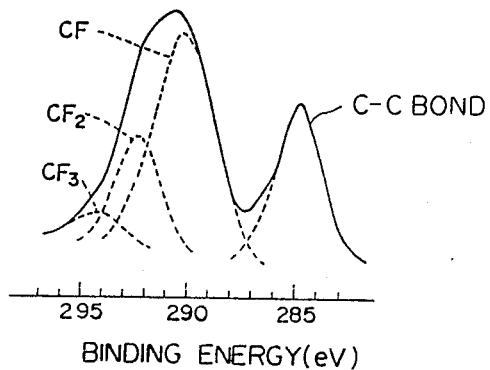

In FIGS. 4 to 10, there are shown $C_{1s}$ ESCA spectra (X-ray: MgKα line). Specifically, FIG. 4 shows the ESCA spectrum of a pitch fluoride according to the present invention prepared by reacting a hydrogenated mesophase pitch with fluorine at 0° C. for 312 hours in a reaction vessel maintained at 1 atm, which is shown in comparison with that of the starting hydrogenated mesophase pitch. In FIGS. 5 to 7, there are shown the ESCA spectra respectively of Teflon, $(CF)_n$ [manufactured and sold by Central Glass Co., Ltd., Japan] and $(C_2F)_n$ [manufactured and sold by Central Glass Co., Ltd., Japan] for the purpose of comparison. FIG. 8 shows the ESCA spectrum of a pitch fluoride according to the present invention prepared by reacting a hydrogenated mesophase pitch with fluorine at 0° C. for 240 hours in a reaction vessel maintained at 1 atm. FIG. 9 shows the ESCA spectrum of a pitch fluoride according to the present invention prepared by reacting meso-carbon microbeads with fluorine at 0° C. for 168 hours in a reaction vessel maintained at 1 atm. FIG. 10 shows the ESCA spectrum of a pitch fluoride according to the present invention prepared by reacting meso-carbon microbeads with fluorine at 100° C. for 144 hours in a reaction vessel maintained at 1 atm. As is apparent from FIG. 4, the peak appearing at about 248.8 eV due to the C-C double bond of hydrogenated mesophase pitch has decreased in the spectrum of the pitch fluoride prepared therefrom. From this, it is presumed that in the pitch fluoride of the present invention, fluorine atoms are added to the C-C double bonds of the aromatic condensed rings. Further, as is apparent from the ESCA spectra shown in FIG. 4 and FIGS. 8 to 10, the pitch fluoride of the present invention is characterized by exhibiting a peak at about 290.0±1.0 eV due to CF group (monofluorocarbon group) and a peak at about 292.5±0.9 eV due to CF$_2$ group (difluorocarbon group). As different from graphite fluorides, (CF)$_n$ and (C$_2$F)$_n$, the intensity ratio of the peak due to CF$_2$ group to the peak due to CF group is within the range of 0.15 to 1.5 although it varies depending on the kind of a pitch employed and the fluorination degree. Such ESCA spectra of the pitch fluorides according to the present invention are quite different from those of Teflon, (CF)$_n$ and (C$_2$F)$_n$ which are respectively shown in FIGS. 5 to 7. The difference in ESCA spectrum between the pitch fluoride of the present invention and Teflon, (CF)$_n$ and (C$_2$F)$_n$ indicates that the pitch fluoride of the present invention is a novel carbon fluoride compound. In particular, it is conventionally known that CF$_2$ groups are present as the peripheral groups in the periphery of a layer of hexagonal carbon network of a graphite fluoride. Illustratively stated, as is apparent from FIGS. 6 and 7, in the ESCA spectra of the graphite fluorides, the intensity of the peak ascribed to CF$_2$ group is much lower than the intensity of the peak ascribed to CF group. By contrast, with respect to the pitch fluoride of the present invention, both the peaks respectively corresponding to CF and CF$_2$ groups are high. This also indicates that in the pitch fluoride of the present invention, CF$_2$ groups are not merely peripheral groups but constitute one of the principal components of the pitch fluoride, as opposed to the CF$_2$ groups in a graphite fluoride.

Figure 11:
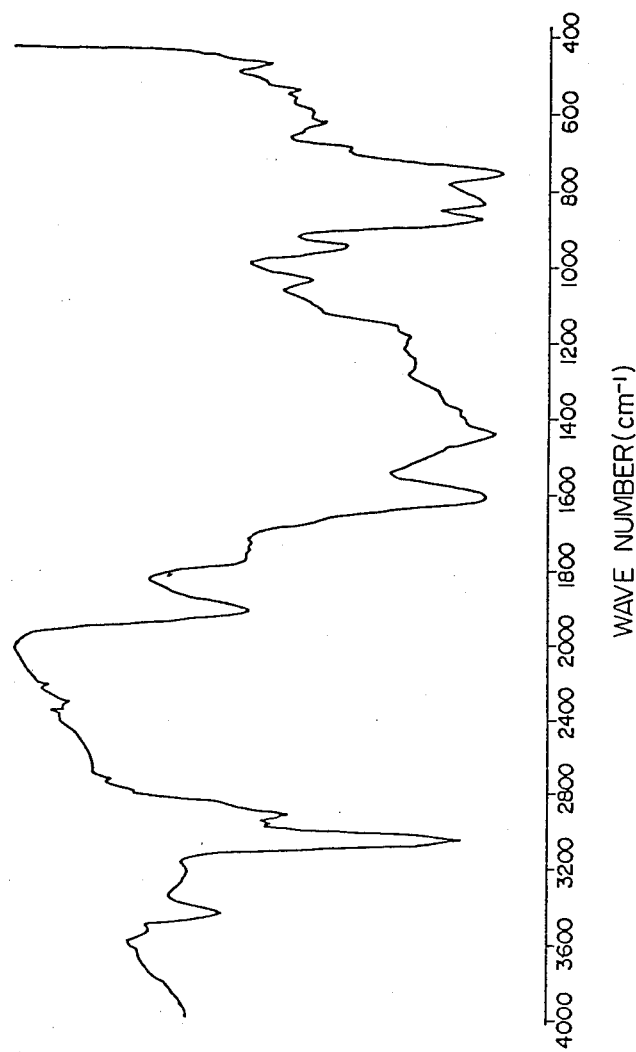
FIG. 11 shows the IR (infrared absorption) spectrum of a hydrogenated mesophase pitch.
Figure 12:
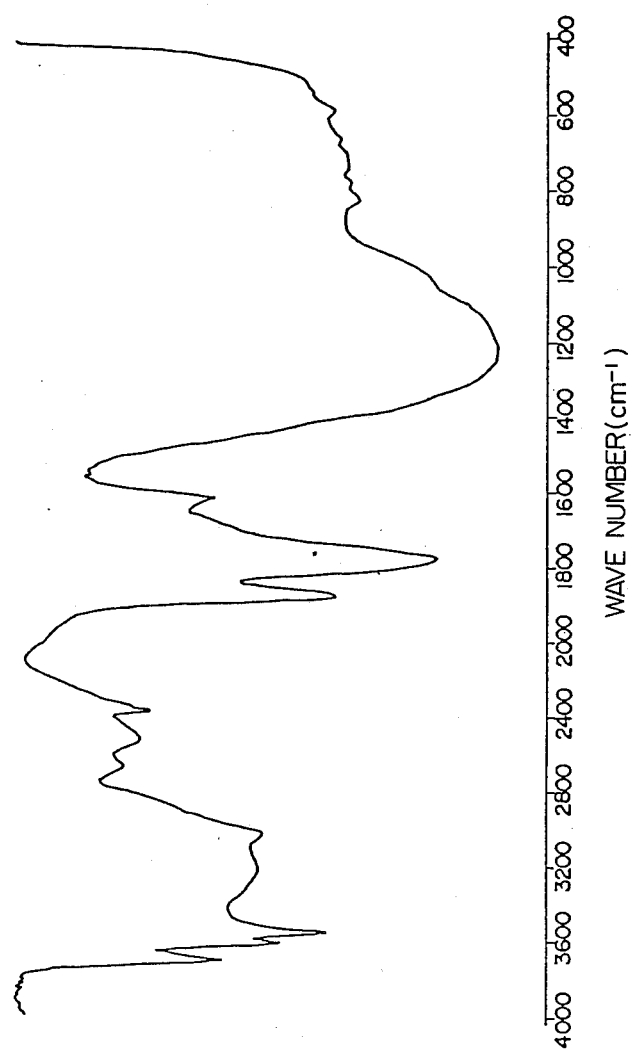
FIGS. 12 and 13 show the IR spectra of pitch fluorides according to the present invention which have been prepared using the hydrogenated mesophase pitch shown in FIG. 11 as a raw material.
Figure 13:
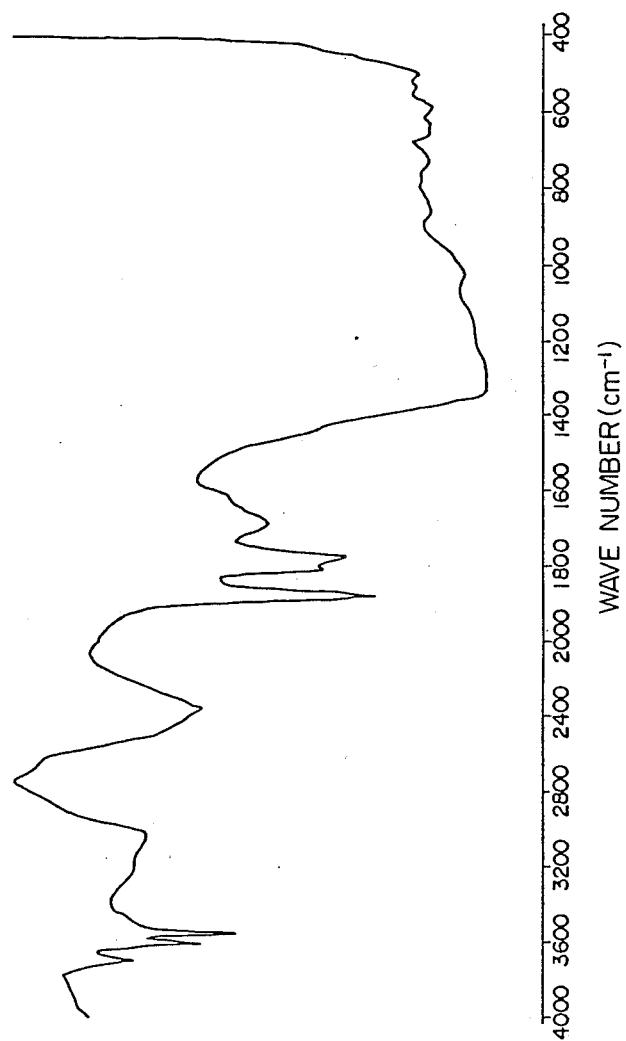
Figure 14:
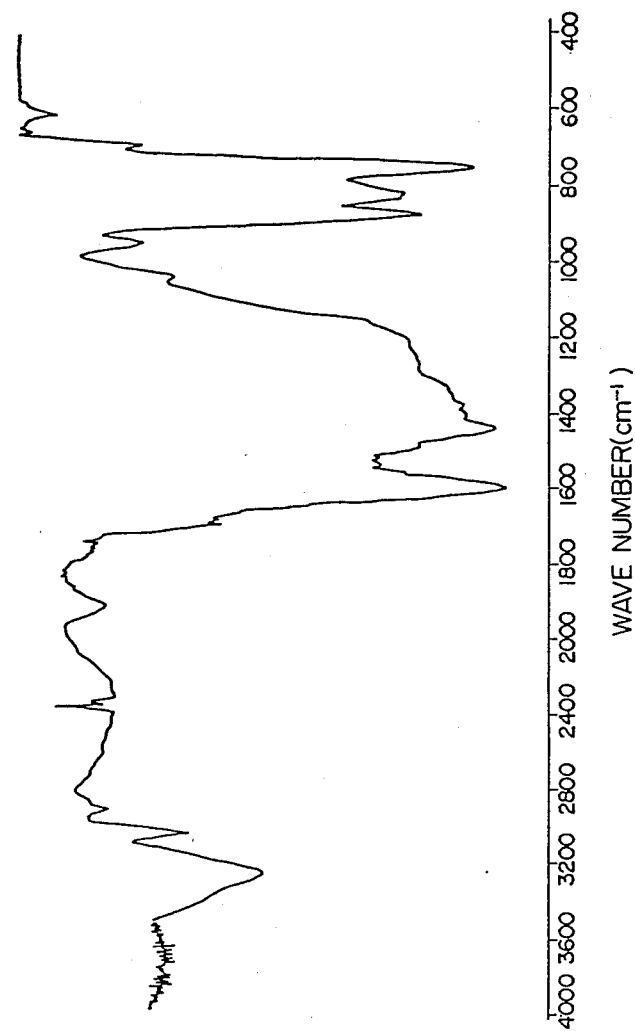
FIG. 14 shows the IR spectrum of a meso-carbon microbead.
Figure 15:
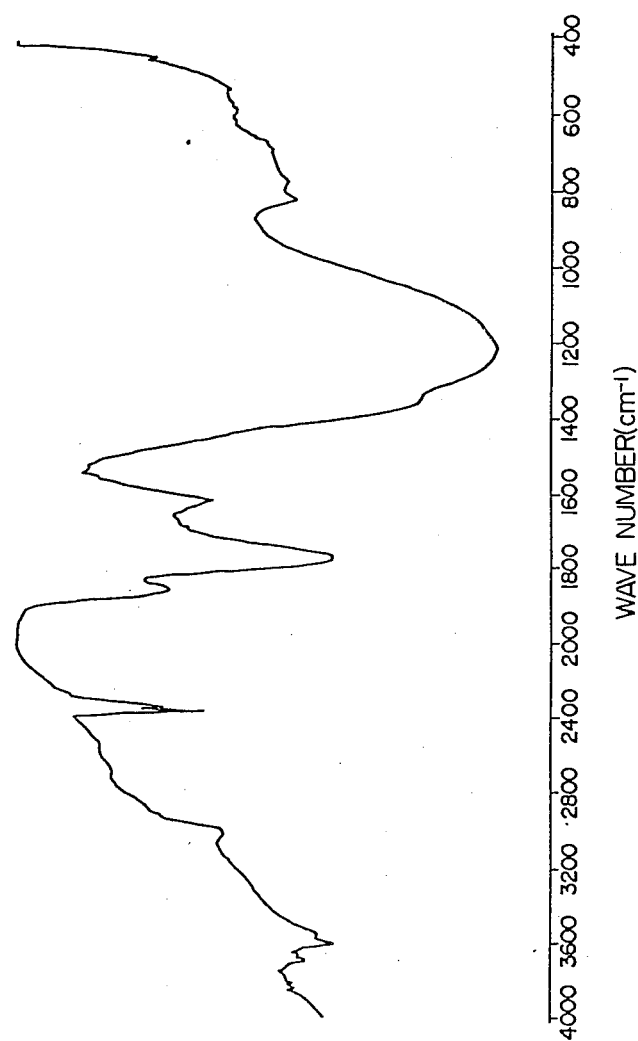
FIG. 15 shows the IR spectrum of a pitch fluoride according to the present invention which has been prepared using the meso-carbon microbeads shown in FIG. 14 as a raw material.
Figure 16:
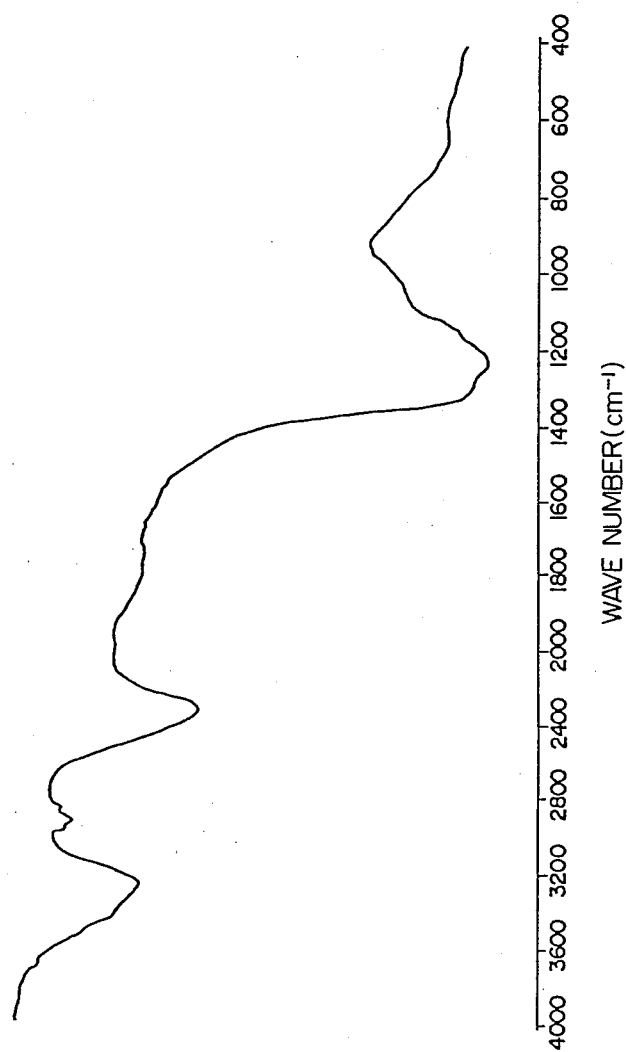
FIGS. 16 and 17 show the IR spectra of $(CF)_n$ and $(C_2F)_n$, respectively.
Figure 17:
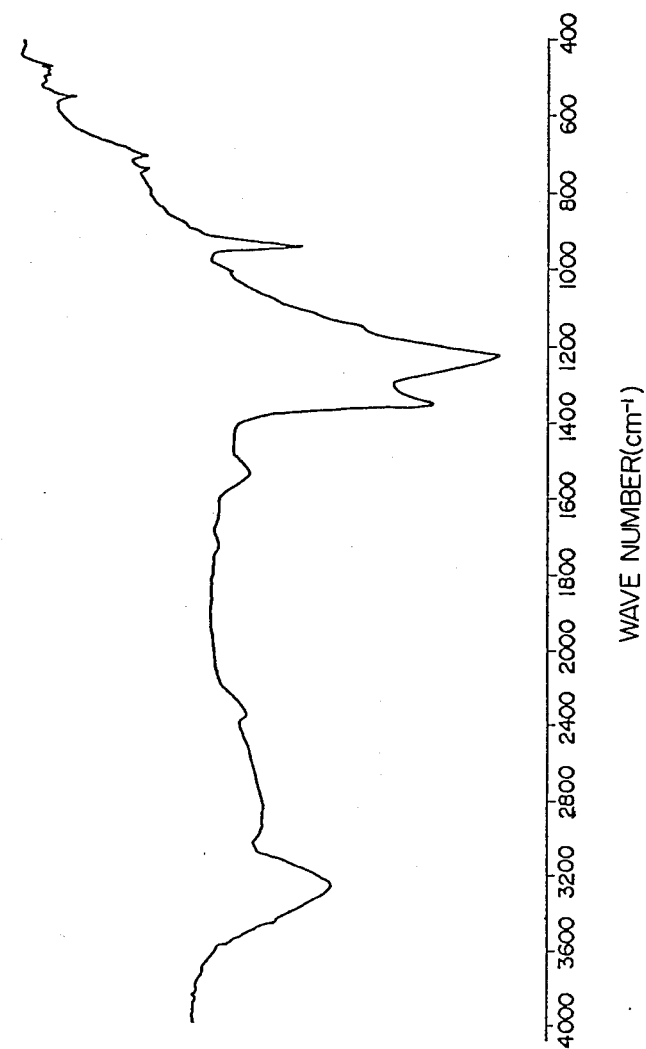
Figure 18:
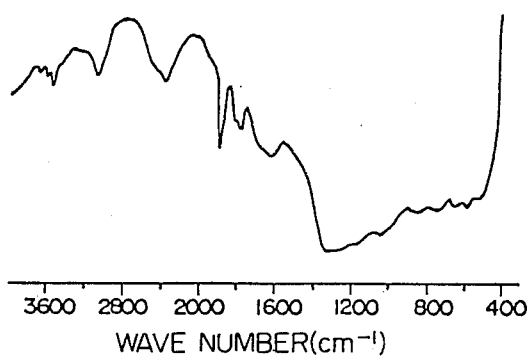
FIGS. 18, 19, 20 and 21 respectively show the IR spectra of the pitch fluorides according to the present invention which have been prepared in Examples 3, 4, 6 and 7 as will be mentioned later.
Figure 19:
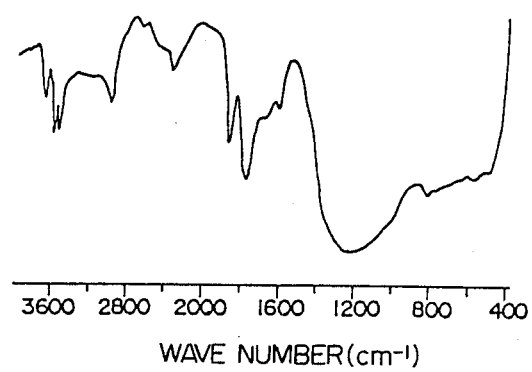
Figure 20:
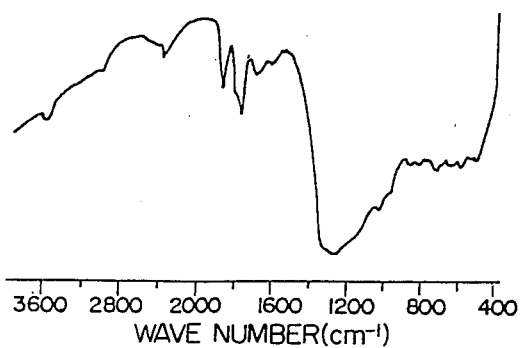
Figure 21:
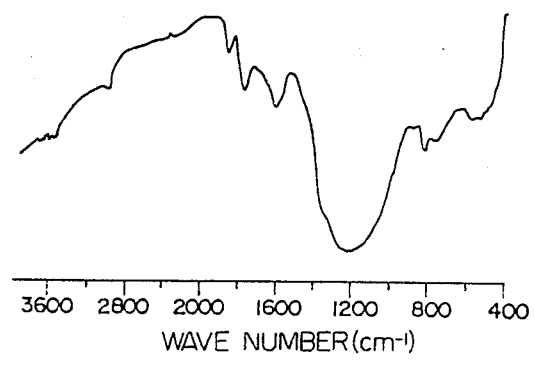

Infrared spectrophotometric (IR) studies have been made with reference to FIGS. 11 to 21. In FIG. 11 there is shown the IR spectrum of a hydrogenated mesophase pitch which is to be used as raw material for the pitch fluoride of the present invention. In FIG. 12 there is shown the IR spectrum of a pitch fluoride prepared by reacting the hydrogenated mesophase pitch shown in FIG. 11 with fluorine at 0° C. for 240 hours in a reaction vessel maintained at 1 atm. In FIG. 13 there is shown the IR spectrum of a pitch fluoride prepared by reacting the hydrogenated mesophase pitch shown in FIG. 11 with fluorine at 0° C. for 312 hours in a reaction vessel maintained at 1 atm. In FIG. 14 there is shown the IR spectrum of meso-carbon microbeads which may also be used as raw material for the pitch fluoride of the present invention. In FIG. 15 there is shown the IR spectrum of a pitch fluoride prepared by reacting meso-carbon microbeads shown in FIG. 14 with fluorine at 0° C. for 168 hours in a reaction vessel maintained at 1 atm. In FIG. 16 there is shown the IR spectrum of (CF)$_n$ (manufactured and sold by Central Glass Co., Ltd., Japan). In FIG. 17 there is shown the IR spectrum of (C$_2$F)$_n$ (manufactured and sold by Central Glass Co., Ltd., Japan). In FIG. 18 there is shown the IR spectrum of a pitch fluoride prepared by reacting the hydrogenated mesophase pitch shown in FIG. 11 with fluorine at 100° C. for 240 hours in a reaction vessel maintained at 1 atm. In FIG. 19 there is shown the IR spectrum of a pitch fluoride prepared by reacting the hydrogenated mesophase pitch shown in FIG. 11 with fluorine at 150° C. for 261 hours in a reaction vessel maintained at 1 atm. In FIG. 20 there is shown the IR spectrum of a pitch fluoride prepared by reacting meso-carbon microbeads shown in FIG. 11 with fluorine at 100° C. for 144 hours in a reaction vessel maintained at 1 atm. In FIG. 21 there is shown the IR spectrum of a pitch fluoride prepared by reacting meso-carbon microbeads shown in FIG. 14 with fluorine at 250° C. for 336 hours in a reaction vessel maintained at 1 atm. The pitch fluorides of the present invention exhibit absorption peaks due to a C-F stretching vibration, a CF$_2$ symmetrical stretching vibration and a CF unsymmetrical stretching vibration in the range of wave number smaller than 1600 cm$^{-1}$. With respect to the pitch fluorides having a fluorination degree (as defined herein) of about 90% or less, as is seen from FIGS. 13, 18 and 20 in comparison with FIGS. 16 and 17, the IR spectrum exhibit absorption peaks at 1770±20 cm$^{-1}$, 1800±20 cm$^{-1}$ and 1870±20 cm$^{-1}$ which are not found for (CF)$_n$ and (C$_2$F)$_n$. In this connection, it is noted that the absorption peak at 1770±20 cm$^{-1}$ and the absorption peak at 1800±20 cm$^{-1}$ are very close to each other and, therefore, as shown in FIGS. 12, 15, 19 and 21, these peaks do sometimes overlap to assume a single peak. With respect to the pitch fluorides having a fluorination degree of more than about 90%, the above-mentioned peaks at 1770±20 cm$^{-1}$, 1800±20 cm$^{-1}$ and 1870±20 cm$^{-1}$ become small, and the peaks disappear eventually.

The elementary analysis shows that the pitch fluoride of the present invention is composed substantially of carbon and fluorine and the F/C atomic ratio is within the range of about 0.5 to about 1.8 although it varies depending on the fluorination degree.

The color of the pitch fluoride of the present invention varies depending on the kind of a pitch employed as a raw material and the degree of fluorination. For example, the pitch fluorides prepared from isotropic pitches and hydrogenated mesophase pitches are generally yellowish white or white. On the other hand, the color of the pitch fluorides prepared from meso-carbon microbeads is generally brown and changes from brown through yellowish white to white as the fluorination degree becomes large. From the above fact that the color of a pitch changes from black which is considered to be attributable to a multiple bond (specifically, double bond) of the pitch through brown and yellowish white to white as the fluorination degree becomes large, it is presumed that the pitch fluoride of the present invention has a structure such that fluorine atoms have been added to the multiple bonds present in the aromatic condensed rings contained in a pitch.

In FIGS. 22 to 26, there are shown TGA and DTA curves of the pitch fluorides according to the present invention. As is apparent from FIGS. 22 to 26, the pitch fluorides of the present invention decompose with decrease in weight by heating at temperatures of about 250° to about 600° C. In this connection, it should be noted that when heated in air, nitrogen gas or inert gas such as argon, the pitch fluoride according to the present invention undergoes decomposition to produce a fluoro compound which is solid at room temperature and generally exhibits white, yellowish white or brown color, as opposed to graphite fluorides such as (CF)$_n$ and (C$_2$F)$_n$ which exothermically decompose by heating to produce gaseous fluorocarbons, such as CF$_4$ and C$_2$F$_6$.

The thermal stability of pitch fluorides varies slightly depending on the kind of a pitch employed as raw material and the reaction conditions, such as reaction temperature, but, in general, as mentioned above, when the pitch fluoride is heated at temperatures higher than the temperatures employed for the formation of the pitch fluoride (about 250° to about 600° C.) in air, nitrogen gas or inert gas such as argon, it decomposes to produce a solid fluoro compound. The solid fluoro compound produced by the thermal decomposition of a pitch fluoride is capable of forming a film on various substrates by vacuum deposition or sputtering.

Alternatively, when the pitch fluoride is heated at temperatures of about 250° to about 600° C. in vacuo, the thermal decomposition of the pitch fluoride and formation of a film due to the vacuum evaporation of the decomposition product occur simultaneously and, hence, a film can be directly produced from a pitch fluoride in one step. With respect to the formation of a film and properties of the film, a detailed explanation will be given later.

The pitch fluoride of the present invention has water-repellent and oil-repellent properties comparable to those of graphite fluorides, such as $(CF)_n$ and $(C_2F)_n$, and superior to those of Teflon. Table 1 shows the contact angles of a pitch fluoride of the present invention and a film produced from the pitch fluoride against water and glycerine, together with those of $(CF)_n$, $(C_2F)_n$, Teflon.

TABLE 1

| | Contact angle (30° C.) | | | | |
|---|---|---|---|---|---|
| Liquid | Pitch fluoride *1 | Thermal decomposition product of pitch fluoride *2 | $(CF)_n$ *3 | $(C_2F)_n$ *3 | Teflon *3 |
| Water | 141° ± 8° | 113° ± 5° | 143° ± 2° | 141° ± 6° | 109° ± 3° |
| Glycerine | 140° ± 5° | 104° ± 6° | 151° ± 2° | 145° ± 7° | 105° ± 3° |

Note
*1: Tablets prepared by pressing under a pressure of 500 kg/cm$^2$ the pitch fluoride obtained in Example 2 as will be given later.
*2: Film prepared on an aluminum by subjecting the pitch fluoride obtained in Example 2 as will be given later to vacuum deposition at temperatures up to 600° C. under pressures of $5 \times 10^{-5}$ to $1 \times 10^{-4}$ mmHg.
*3: Data reported in "Hyomen (Surface)" Vol. 19, No. 9, 502–512 (1981)

The pitch fluoride of the present invention can be prepared by reacting a pitch or meso-carbon microbeads with fluorine.

Examples of pitches to be used in the present invention include products obtained by distilling petroleum heavy oil or coal heavy oil, such as a still residue of petroleum distillation, thermal decomposition residue of naphtha, ethylene bottoms, liquefied coal oil and coal tar, to remove low boiling components having boiling points lower than 200° C., and also include products obtained by subjecting the above-obtained substances to further treatment, such as heat treatment and hydrogenation. Examples of pitches also include products obtained by subjecting petroleum heavy oil or coal heavy oil to treatment such as heat treatment and/or hydrogenation and subjecting the treated oil to distillation to remove low boiling components having boiling points lower than 200° C. As representative examples thereof, there may be mentioned an isotropic pitch, a mesophase pitch, a hydrogenated mesophase pitch, etc. The isotropic pitch can be prepared by distillation of the above-described petroleum heavy oil or coal heavy oil to remove low boiling components having boiling points lower than 200° C. The mesophase pitch can be prepared by heating petroleum heavy oil, coal heavy oil or isotropic pitch in an atmosphere of argon gas at 300° to 500° C. until the content of anisotropic components in the resulting pitch becomes 90% or more. The content of anisotropic components may be determined by the use of a polarizing microscope. The hydrogenated mesophase pitch can be prepared by adding a hydrogen donor, such as tetrahydroquinoline and hydrogenated aromatic hydrocarbon, to an isotropic pitch at an isotropic pitch/hydrogen donor weight ratio of 1:10 to 10:1 and reacting them with each other in an atmosphere of argon gas at 300° to 500° C. for 1 minute to 1 hour. Further, as described above, meso-carbon microbeads can also be used as a raw material. Meso-carbon microbeads can be prepared by the method which comprises distilling petroleum heavy oil or coal heavy oil to remove low boiling components, subjecting the resultant residue to heat treatment, then subjecting the heat-treated residue to extraction with, for example quinoline to remove quinoline-soluble components, and collecting the resultant mesophase spheres as an insoluble matter from the matrix. As described before, a pitch or meso-carbon microbeads have an atomic ratio of carbon to hydrogen atoms (C/H ratio) of 2.5 or less whereas a coke or graphite has a C/H ratio of 8 or more. Accordingly, the size of the aromatic hexagonal carbon network plane of a coke or graphite is almost infinitely large, whereas that of a pitch or meso-carbon microbeads is considerably small and the pitch or meso-carbon microbeads rather belongs to the category of organic compounds.

In producing a pitch fluoride by direct fluorination of a pitch or meso-carbon microbeads in an atmosphere of a fluorine gas, the reaction temperature is not critical, and the reaction proceeds even at a temperature of less than 0° C. However, when the reaction temperature is less than 0° C., it needs a long time to produce a pitch fluoride. On the other hand, when the reaction temperature is higher than 350° C., gaseous fluorocarbons, such as $CF_4$ and $C_2F_6$, are formed as by-products, causing the yield of the pitch fluoride to be lowered. Therefore, it is preferable that the reaction be effected at 0° to 350° C. Further, from the viewpoints of reaction time and stability of reaction, it is preferable to conduct the reaction at a temperature lower than the softening point of the pitch.

The reaction time is not particularly critical. However, in view of the use of the pitch fluoride, it is preferable that the reaction be conducted until the fluorination degree becomes 50% or more, preferably 70% or more. The term "fluorination degree" as used herein is intended to mean the degree of fluorination taking as 100% the fluorination degree in the case where the weight of the reaction product is 2.58 times that of the starting pitch or meso-carbon microbeads. The pitch fluoride of the present invention may have a fluorination degree more than 100%.

The pressure of fluorine to be used in the fluorination of a pitch is not critical and is generally in the range of 0.07 to 1.5 atm.

In the present invention, a fluorine gas may be used as it is or after diluted with an inert gas. As examples of the inert gas which may be used for diluting fluorine, there may be mentioned argon, helium, neon, etc. The inert gas may be generally used at a ratio not higher than 95% by volume relative to the fluorine gas.

In the production of a pitch fluoride, as a material for the equipments to be used in association with the reaction vessel, there may be used any of copper, stainless steel, Monel metal, nickel, etc. Further, as a material for the reaction vessel, in the case where the reaction temperature not higher than 150° C. is employed, there may be used any of stainless steel, Monel metal and nickel. On the other hand, in the case where the reaction is effected at a temperature higher than 150° C., Monel metal is satisfactory as a material for the reaction vessel but nickel is preferably employed from the viewpoint of corrosion resistance.

As is apparent from the foregoing, the pitch fluoride, namely carbon fluoride according to the present invention, not only has properties, such as water-repellent and oil-repellent properties, which are comparable to those of graphite fluorides, such as $(CF)_n$ and $(C_2F)_n$, but also has unique properties such that the thermal decomposition thereof gives a novel fluoro compound which is solid at room temperature. The fluoro compound as well as the pitch fluoride is capable of forming a solid film having excellent properties comparable to those of the pitch fluoride. Accordingly, the pitch fluoride of the present invention is useful as a solid lubricant, an anti-wetting agent, a stain-proofing agent, water- and oil-repellent, and an active material for use in primary cells. In addition, the pitch fluoride of the present invention can be used as a raw material for water- and oil-repellent thin films which are expected to be advantageously used as a coating substance.

In another aspect of the present invention, there is provided a fluoro compound produced by the thermal decomposition of a carbon fluoride at about 250° to about 600° C. in an atmosphere of a member selected from the group consisting of air, a nitrogen gas and an inert gas, which exhibits:

(e) a solid state at room temperature;

(f) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;

(g) a property that it is capable of forming a film by vacuum deposition; and (h) a contact angle of 105°±15° against water as measured at a temperature of 30° C. with respect to the fluoro compound which is in the form of a film, said carbon fluoride being a solid compound, comprising carbon atoms and fluorine atoms and having a structure in which layers containing fluorinated condensed cyclohexane rings are stacked to form a packing, structure, the atomic ratio of fluorine to carbon atoms being 0.5 to 1.8, the carbon fluoride exhibiting:

(a) in the powder X-ray diffraction pattern, a peak having a maximum intensity at about 13° ($2\theta$), a peak at about 40° ($2\theta$) having an intensity lower than that of the peak appearing at about 13° ($2\theta$) and no peak on the low side of diffraction angle relative to 13° ($2\theta$);

(b) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;

(c) a property that it is capable of forming a film by vacuum deposition; and (d) a contact angle of 141°±8° against water as measured at a temperature of 30° C.

As described, when the pitch fluoride as mentioned above is heated at temperatures higher then the temperature employed for the formation of the pitch fluoride (about 250° to 600° C.) in air, a nitrogen gas or an inert gas such as argon, it decomposes to produce a fluoro compound which is solid at room temperature. The solid fluoro compound may be obtained by, for example, heating the pitch fluoride at about 250° to about 600° C. in a nitrogen gas in a vessel to evaporate the pitch fluoride with decomposition, and collecting and cooling the resulting gaseous decomposition product in a trap provided in communication with the vessel. The gaseous decomposition product may be deposited at room temperature to temperatures lower than the decomposition temperature. In the ESCA spectrum of the solid fluoro compound thus obtained, there are observed a peak due to a CF group at about 290.0±1.0 eV and a peak due to a $CF_2$ group at about 292.5±0.9 eV. The intensity ratio of the peak due to $CF_2$ group to the peak due to CF group varies depending on the kind and fluorination degree of the pitch fluoride used for obtaining the fluoro compound by decomposition, but is within the range of 0.15 to 1.5. The elementary analysis shows that the fluoro compound is composed substantially of carbon and fluorine, and the F/C atomic ratio is within the range of 0.5 to 1.8 although it varies depending on the kind of the pitch fluoride used for obtaining the fluoro compound by decomposition. The color of the fluoro compound is substantially the same as that of the starting pitch fluoride.

The present fluoro compound is capable of forming a film by vacuum evaporation, and exhibits a contact angle of 105±15° against water as measured at a temperature of 30° C. with respect to the fluoro compound which is in the form of a film. Accordingly, it has the same utilities as those of the pitch fluoride. In addition, in view of the peculiar properties, a wide variety of uses are expected.

In a further aspect of the present invention, there is provided a film which is solid at room temperature, comprising carbon atoms and fluorine atoms and having a structure in which layers containing fluorinated condensed cyclohexane rings are stacked to form a packing structure, the atomic ratio of fluorine to carbon atoms being 0.5 to 1.8, the film exhibiting:

(i) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5; and (j) a property that when it is subjected to vacuum deposition, it evaporates and subsequently deposits on a substrate maintained at a temperature lower than the temperatures employed for the vacuum deposition.

As described above, when the pitch fluoride is heated at temperatures of about 70° to about 600° C. in vacuo, the formation of a film due to the vacuum evaporation of sublimating components and/or due to the vacuum evaporation of a decomposition product on a substrate occurs and, therefore, the formation of a film from a pitch fluoride can be directly performed. As will be easily understood from FIGS. 22 to 26 illustrating the TGA and DTA curves of the pitch fluoride, the pitch fluoride usually contains sublimating components in an amount of about 1 to 10%. If the formation of a film composed only of the sublimating components is intended, it is preferable that the temperatures for the vacuum deposition be about 70° to 150° C., provided that the temperatures are higher than the temperature employed for the production of the pitch fluoride. In producing a film through the decomposition of the pitch fluoride, the temperatures for the vacuum deposition are preferably about 250° to about 600° C., provided that the temperatures are higher than the temperature employed for the production of the pitch fluoride.

The vacuum deposition or vacuum evaporation is a well known technique. Any customary method for the vacuum deposition may be employed in the present invention. For example, with respect to the apparatus for the vacuum deposition, reference may be made to the catalogue entitled "HIGH VACUUM EVAPORATION SYSTEM" published by Nihon Shinku Gijutsu K.K., Japan. In forming a film by vacuum deposition, the pressure to be employed may be about $1 \times 10^{-7}$ to $1 \times 10^{-3}$ mmHg.

The substrate to be used for forming a film thereon may be in any form or shape. In addition, any desired material, such as glass, plastic and metal may be used as a material of the substrate for forming a film thereon.

Figure 27:
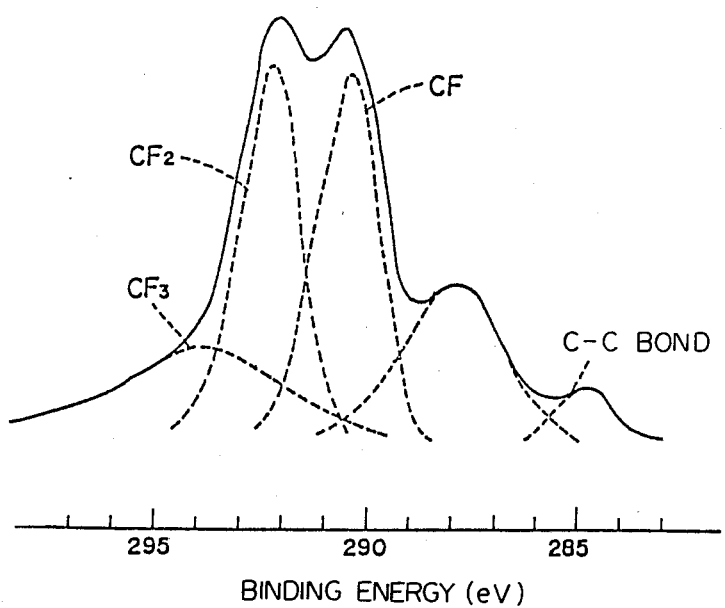
FIGS. 27 and 28 respectively show the ESCA spectrum and IR spectrum of a film formed by vacuum deposition in Example 8 as will be mentioned later.
Figure 28:
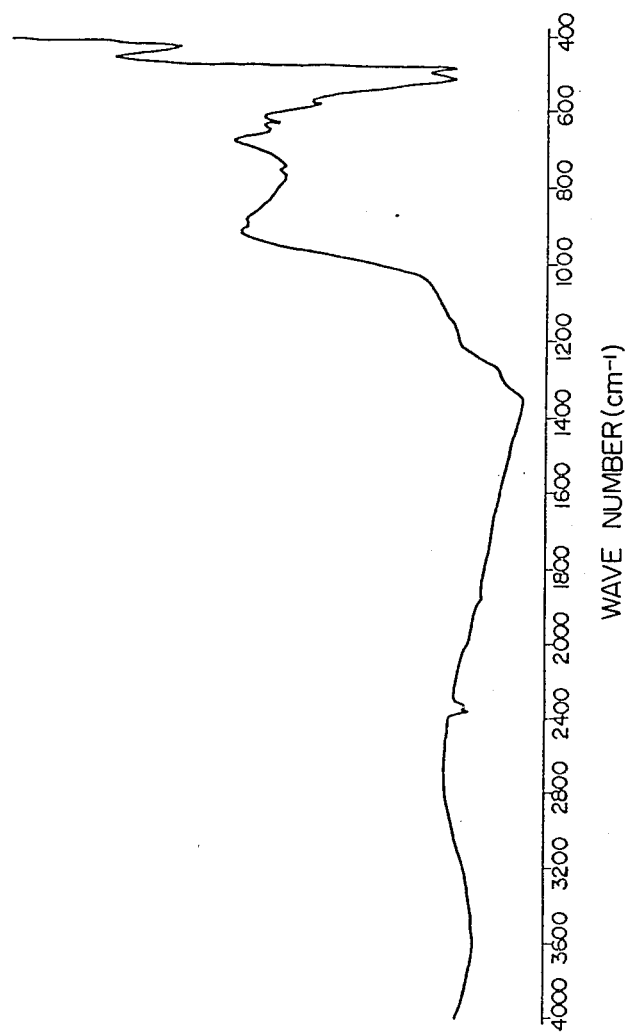

With respect to a solid film formed on an aluminum plate by subjecting the pitch fluoride of which the ESCA spectrum and IR spectrum are respectively shown in FIGS. 4 and 13 to vacuum deposition under $5 \times 10^{-5}$ to $1 \times 10^{-4}$ mmHg (see Example 8 which will be given later), studies are made. The ESCA spectrum and IR spectrum of the film are shown in FIGS. 27 and 28, respectively. As is apparent from the comparison of FIG. 27 with FIG. 4, the ESCA spectrum of the film obtained by vacuum deposition of the pitch fluoride exhibits a new peak at a position between 285 eV and 290 eV which is not found in the ESCA spectrum of the starting pitch fluoride as shown in FIG. 4. In this connection, it is noted that the pitch fluorides having a fluorination degree (as defined herein) of about 90% or less originally exhibit a peak at a position between 285 eV and 290 eV in the ESCA spectrum as shown in FIGS. 8 and 9. In that case, the new peak characteristic of the film formed by the vacuum deposition of such pitch fluoride overlaps the original peak to produce a high intensity peak.

The thickness of the solid film obtained directly from the pitch fluoride by vacuum deposition is not critical. The thickness may be increased by increasing the amount of the pitch fluoride as raw material and increasing the time of vacuum deposition. On the other hand, the film may be prepared to have a thickness as small as about $1 \times 10^2$ Å. In general, the thickness may be about $1 \times 10^2$ to about $1 \times 10^4$ Å, preferably about $5 \times 10^2$ to about $1 \times 10^4$ Å. The color of the film is substantially the same as that of the starting pitch fluoride. The film obtained is hard and uniform.

In the ESCA spectrum of the film thus obtained, there are observed a peak due to a CF group at about $290.0 \pm 1.0$ eV and a peak due to a $CF_2$ group at about $292.5 \pm 0.9$ eV. The intensity ratio of the peak due to $CF_2$ group to the peak due to CF group varies depending on the kind and fluorination degree of the pitch fluoride used for obtaining the film by vacuum deposition, but is within the range of 0.15 to 1.5. The elementary analysis shows that the film is composed substantially of carbon atoms and fluorine atoms, and the F/C atomic ratio is within the range of 0.5 to 1.8 although it varies depending on the kind of the pitch fluoride used for obtaining the film by vacuum deposition.

Still another characteristic feature of the solid film of the present invention resides in that when the film once formed is subjected to vacuum deposition again at the same temperatures as used for the formation of the film, namely, about 70° to about 600° C. or about 250° to about 600° C., the substance constituting the film evaporates and can form a film on another substrate maintained at a temperature lower than about 70° to 250° C., as is quite different from other carbo-fluoro type films, such as Teflon.

The present film exhibits a contact angle of $105 \pm 15°$ against water. The present film has substantially the same properties as those of the pitch fluoride and, hence, it is useful, for example, as a water-repellent and oil repellent coating for various substrates, e.g., an electric wire cable etc.

On the other hand, as mentioned hereinbefore, when the pitch fluoride is heated at temperatures of about 250° to 600° C. in air, a nitrogen gas or an inert gas such as argon, it decomposes to produce a fluoro compound which is solid at room temperature. The solid fluoro compound may be obtained by, for example, heating the pitch fluoride at temperatures of about 250° to about 600° C. (provided that the temperatures are higher than the temperature employed for the formation of the pitch fluoride) in a nitrogen gas in a vessel to evaporate the pitch fluoride with decomposition, and collecting and cooling the resulting gaseous decomposition product in a trap provided in communication with the vessel. The gaseous decomposition product may be deposited at room temperature to temperatures lower than about 250° C.

When the fluoro compound thus obtained as the decomposition product is heated at temperatures of about 70° to about 600° C. in vacuo, the fluoro compound evaporates and deposits on a substrate maintained at room temperature to about 250° C., thereby to form a solid film on the substrate. The composition, properties and characteristics of the solid film obtained from the fluoro compound are substantially the same as those of the solid film obtained directly from the pitch fluoride.

This invention will now be described in more detail with reference to the following examples which by no means should be construed to be limiting the scope of the present invention.

In the following examples, the analyses of pitches, pitch fluorides, decomposition product of the pitch fluoride and films produced therefrom were carried out by the following methods.

(1) X-ray diffractometry

Apparatus: X-ray diffraction apparatus manufactured and sold by JEOL, LTD., Japan
X-ray: CuKα line
Tube voltage-tube current: 40 kV-20 mA (2) ESCA (electron spectroscopy for chemical analysis)

Apparatus: ESCA 650B type photoelectric spectrophotometer manufactured and sold by E. I. Du Pont De NUMOURS AND COMPANY, U.S.A.
X-ray: MgKα line
Pressure: $5 \times 10^{-8}$ Torr

(3) IR analysis (infrared spectroscopic analysis)

Apparatus: 60 SX type FT-IR apparatus manufactured and sold by Nicolet Co., Ltd., U.S.A.

Method: Diffuse reflection method (integrated number: 500)

(4) TGA and DTA (thermogravimetric analysis and differential thermal analysis)

Apparatus: Thermal analysis apparatus manufactured and sold by Rigaku Denki K.K., Japan
Atmosphere: $N_2$
Reference substance: $Al_2O_3$
Temperature elevation rate: 10° C./min

(5) QI (quinoline insoluble fraction)

Measured according to JIS (Japanese Industrial Standards)-K2425.

(6) BI (benzene insoluble fraction)

Measured according to JIS-K 2425 except that benzene was used instead of toluene.

(7) Softening point

Apparatus: Softening point measuring apparatus (FR-80/83) manufactured and sold by Mettler Instruments AG, Switzerland

(8) Elementary analysis

Carbon, hydrogen and nitrogen: Conducted using a CHN recorder MT-3 (manufactured and sold by Yanagimoto Seisakusho, Japan)

Fluorine: Conducted by Oxygen-Flask method under conditions described in the Journal "Japan Analyst 467–473, Vol. 20 (1971)".

EXAMPLE 1

To a coal tar pitch (QI=0%) was added an equal amount of a hydrogenated anthracene oil, and the resulting mixture was heated up to 450° C. at a temperature elevation rate of 15° C./min, followed by heat treatment at a temperature of 450° C. in an atmosphere of nitrogen gas for 1 hour to give a hydrogenated mesophase pitch having a QI content of 39.4%, a BI content of 93.5% and a softening point of 307° C. The above-obtained hydrogenated mesophase pitch was subjected to elementary analysis. The results were as follows:
C: 95.39%
H: 3.79%
N: 0.66%
O: 0.79%

The hydrogenated mesophase pitch was subjected to various measurements. The X-ray diffraction pattern, ESCA spectrum and IR spectrum obtained are shown in FIGS. 2, 4 and 11, respectively.

1 g of the above-prepared hydrogenated mesophase pitch was placed in a sealed-type cylindrical reaction vessel made of nickel (capacity: 500 ml) equipped with a jacket. Thereafter, the inside of the reaction vessel was evacuated, and fluorine was introduced thereinto from a fluorine bomb. The contents of the reaction vessel were kept at 0° C. for 240 hours while maintaining the internal pressure of the vessel at 1 atm, thereby to react the hydrogenated mesophase pitch with fluorine. Thus, there was obtained a yellowish white pitch fluoride.

The X-ray diffraction pattern, IR spectrum and ESCA spectrum of the pitch fluoride are shown in FIGS. 2, 12 and 8, respectively.

Further, the thus obtained pitch fluoride was heated to effect thermal decomposition thereof. When the temperature of the pitch fluoride reached about 380° C., an exothermic reaction took place with drastic decrease in weight. The exothermic reaction continued until the temperature reached about 510° C., thereby to give a yellowish white substance. The thus obtained substance was subjected to elementary analysis. The results were as follows.
F: 61.18%
C: 33.38%,
H: 0.3%
F/C ratio: 1.6

EXAMPLE 2

Substantially the same procedures as in Example 1 were repeated, except that the reaction time was changed to 312 hours to give a yellowish white pitch fluoride. The above-obtained pitch fluoride was subjected to X-ray diffractometry. The X-ray diffraction pattern obtained had a peak having the maximum intensity at about 13° ($2\theta$) and a peak at about 40° ($2\theta$) having an intensity lower than that of the peak at about 13° C. ($2\theta$). The ESCA spectrum and IR spectrum of the pitch fluoride are shown in FIGS. 4 and 13, respectively. The above-obtained pitch fluoride was also subjected to elementary analysis. The results were as follows.
F: 65.74%
C: 32.79%
H: 0%
F/C ratio: 1.27

Figure 22:
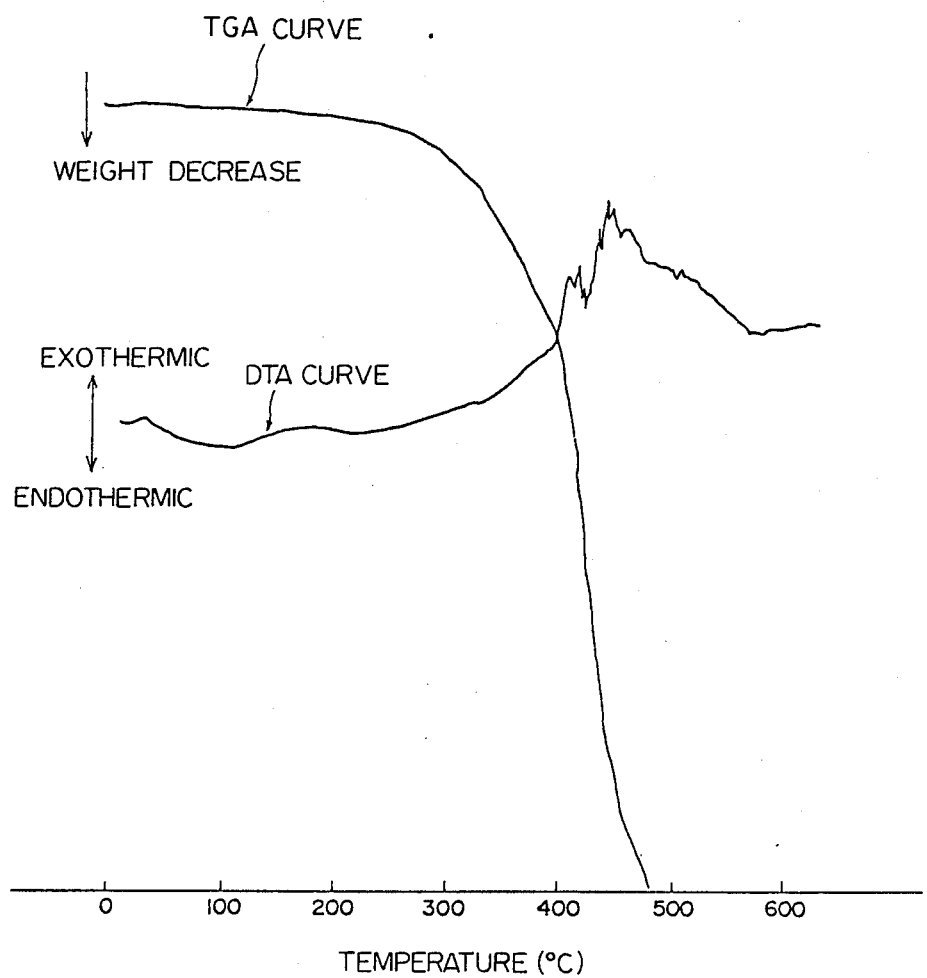
FIG. 22 shows the TGA (thermogravimetric analysis) and DTA (differential thermal analysis) curves of a pitch fluoride according to the present invention.

The results of the TGA and DTA of the thus obtained pitch fluoride are shown in FIG. 22. Incidentally, the color of the thermal decomposition product of the pitch fluoride was yellowish white.

EXAMPLE 3

Substantially the same procedures as in Example 1 were repeated, except that the reaction temperature was changed to 100° C. to give a yellowish white pitch fluoride. The above-obtained pitch fluoride was subjected to elementary analysis. The results were as follows.
F: 64.32%
C: 35.77%
H: 0.1%
F/C ratio: 1.14

Figure 23:
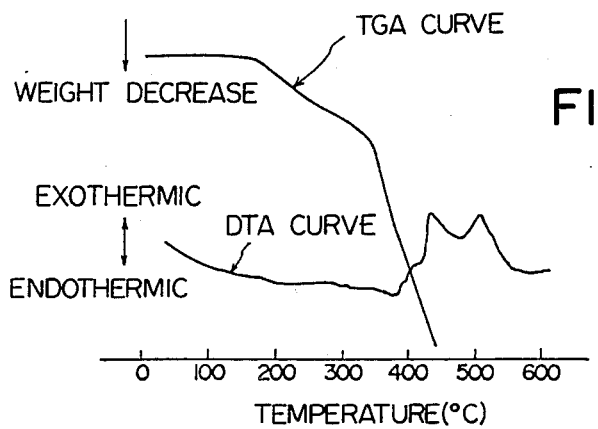
FIGS. 23, 24, 25 and 26 respectively show the TGA and DTA curves of the pitch fluorides according to the present invention which have been prepared in Examples 3, 4, 5 and 6 as will be mentioned later.

The above-obtained pitch fluoride was also subjected to various measurements. The X-ray diffraction pattern, IR spectrum and TGA and DTA curves obtained are shown in FIGS. 2, 18 and 23, respectively. The ESCA spectrum obtained had a peak having a high intensity due to CF groups at about 290.0 eV and a peak having a high intensity due to $CF_2$ groups at about 292.1 eV, and a peak having a lower intensity due to $CF_3$ group at about 294.0 eV.

The thermal decomposition of the pitch fluoride gave a yellowish white substance.

EXAMPLE 4

Substantially the same procedures as in Example 1 were repeated, except that the reaction temperature was changed to 150° C. and that the reaction time was changed to 261 hours. Thus, there was obtained a pitch fluoride having a yellowish white color. The thus obtained pitch fluoride was subjected to elementary analysis. The results were as follows.
F: 65.91%
C: 34.38%
H: 0%
F/C ratio: 1.21

Figure 24:
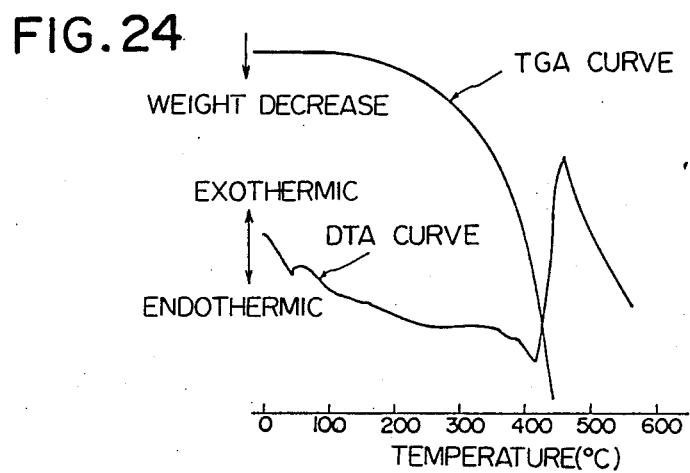
Figure 25:
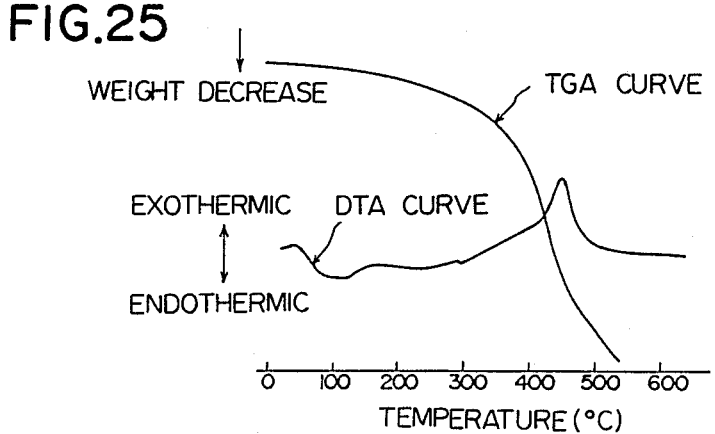
Figure 26:
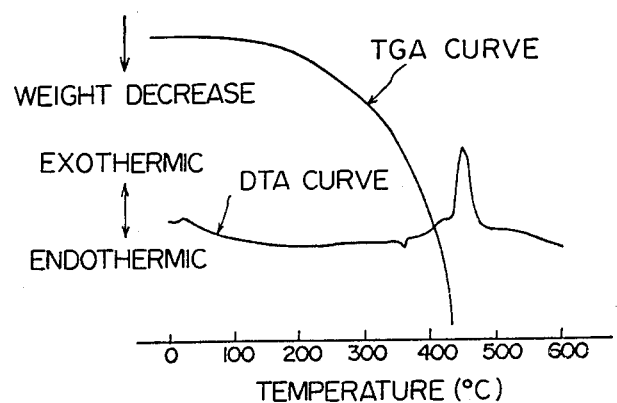

The above-obtained pitch fluoride was also subjected to various measurements. The X-ray diffraction pattern, IR spectrum and TGA and DTA curves of the above-obtained pitch fluoride obtained are shown in FIGS. 2, 19 and 24, respectively. The ESCA spectrum obtained had a peak having a high intensity due to CF group at about 289.5 eV and a peak having a high intensity due to $CH_2$ group at about 292.0 eV, and a peak having a lower intensity due to $CF_3$ at about 294.2 eV.

Further, the thermal decomposition of the pitch fluoride gave a yellowish white substance.

EXAMPLE 5

A coal tar pitch (QI=3.4%) was subjected to heat treatment at 430° C. for 90 minutes. To 100 g of the heat-treated pitch was added 300 ml of quinoline, and the resulting mixture was heated at 95° C. for 1 hour to dissolve and disperse the pitch in the quinoline. The resulting dispersion was centrifuged to collect a quinoline insoluble fraction (QI). To the QI was added 300 ml of a fresh quinoline. The resulting dispersion was subjected to the same operations as described above to collect an QI. The above-mentioned operations comprising adding a fresh quinoline to the collected QI, heating the mixture at 95° C. to disperse QI in quinoline and subjecting the resulting dispersion to centrifuging to collect an QI were repeated three times. Then, substantially the same procedures as mentioned just above were repeated five times, except that all the operations were conducted at room temperature. The thus obtained QI was filtered out using a glass filter No. 4, and the resulting cake was sufficiently washed with benzene to give a meso-carbon microbeads having a QI content of 95.79%, a BI (benzene insoluble fraction) content of 99.39% and an average particle diameter of 50 μm.

The thus obtained meso-carbon microbeads were subjected to elementary analysis. The results were as follows.
C: 94.02%
H: 3.21%
N: 0.88%
O: 1.51%

The above-obtained meso-carbon microbeads were also subjected to X-ray diffractometry and IR analysis. The X-ray diffraction pattern and IR spectrum obtained are shown in FIGS. 3 and 14, respectively.

1 g of the above-prepared meso-carbon microbeads was placed in a sealed-type cylindrical reaction vessel made of nickel (capacity: 500 ml) equipped with a jacket. Thereafter, the inside of the reaction vessel was evacuated, and fluorine was introduced thereinto from a fluorine bomb. The contents of the reaction vessel were kept at 0° C. for 168 hours while maintaining the internal pressure of the vessel at 1 atm, thereby to react the meso-carbon microbeads with fluorine. Thus, there was obtained a brown pitch fluoride.

The above-obtained pitch fluoride was subjected to various measurements. The X-ray diffraction pattern, IR spectrum, ESCA spectrum and TGA and DTA curves obtained are shown in FIGS. 3, 15, 9 and 25, respectively.

Further, the thus obtained pitch fluoride was heated to effect thermal decomposition thereof. As a result, there was obtained a brown substance. The thus obtained substance was subjected to elementary analysis. The results were as follows.
F: 52.90%
C: 33.72%
H: 0.7%
F/C ratio: 0.84

EXAMPLE 6

Substantially the same procedures as in Example 5 were repeated, except that the reaction temperature was changed to 100° C. and that the reaction time was changed to 144 hours. Thus, there was obtained a pitch fluoride having a brown color. The above-obtained pitch fluoride was subjected to various measurements. The X-ray diffraction pattern, ESCA spectrum, IR spectrum and TGA and DTA curves of the pitch fluoride are shown in FIGS. 3, 10, 20 and 26, respectively.

Further, the above-obtained pitch fluoride was heated to effect thermal decomposition thereof. As a result, there was a brown substance. The resulting substance was subjected to elementary analysis. The results were as follows.
F: 65.23%
C: 34.56%
H: 0.2%
F/C ratio: 1.19

EXAMPLE 7

Substantially the same procedures as in Example 5 were repeated, except that the reaction temperature was changed to 250° C. and that the reaction time was changed to 336 hours. Thus, there was obtained a pitch fluoride having a yellowish brown color. The above-obtained pitch fluoride was subjected to X-ray diffractometry and IR analysis. The X-ray diffraction pattern and IR spectrum obtained are shown in FIGS. 3 and 21, respectively. The ESCA spectrum obtained had a peak having a high intensity due to CF group at about 290.3 eV, a peak having a high intensity due to $CF_2$ groups at about 292.3 ev and a peak having a low intensity due to $CF_3$ at about 294.0 eV.

Further, the pitch fluoride was heated. When the temperature of the pitch fluoride reached about 350° C., an exothermic reaction took place with drastic decrease in weight. The exothermic reaction continued until the temperature reached about 500° C., thereby to give a brown substance. The resulting substance was subjected to elementary analysis. The results were as follows.
F: 60.86%
C: 36.10%
H: 0%
F/C ratio: 1.07

Incidentally, the contact angles against water and glycerin of the pitch fluorides prepared in the above Examples are shown in Table 2.

TABLE 2

| Example | Contact angle (30°) | |
|---|---|---|
| | Water | Glycerin |
| 1 | 140 ± 3° | 140 ± 5° |
| 2 | 141 ± 8° | 140 ± 5° |
| 3 | 142 ± 5° | 141 ± 3° |
| 4 | 144 ± 3° | 140 ± 4° |
| 5 | 140 ± 5° | 140 ± 4° |
| 6 | 141 ± 4° | 140 ± 4° |

TABLE 2-continued

| Example | Contact angle (30°) | |
|---|---|---|
| | Water | Glycerin |
| 7 | 140 ± 1° | 139 ± 2° |

The contact angles shown in Table 2 were measured with respect to the samples prepared by shaping the pitch fluorides into tablets under a pressure of 500 kg/cm$^2$.

EXAMPLE 8

Figure 29:
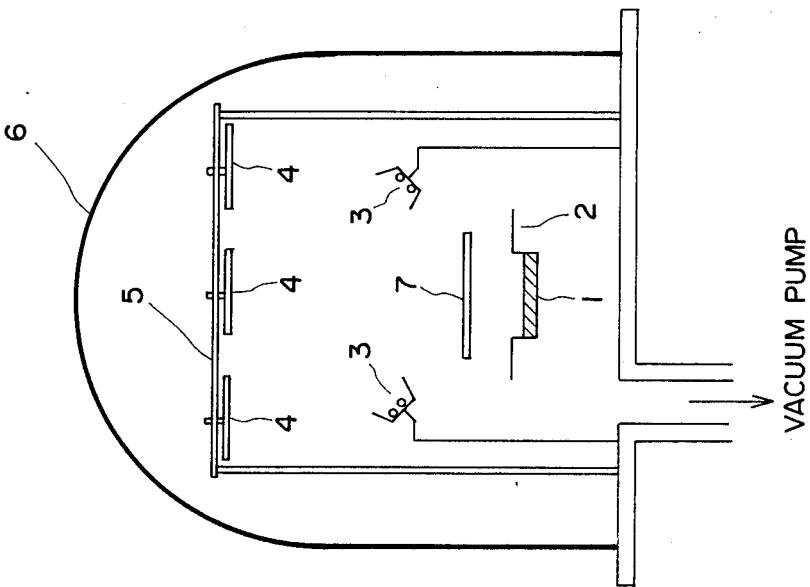
FIG. 29 is a diagrammatic vertical cross-section of an apparatus for vacuum deposition which has been used for the formation of the films in Examples 8, 9, 10 and 11 as will be mentioned later.

For producing a film of the present invention, there was used an apparatus as shown in FIG. 29. In FIG. 29, numeral 1 designates a pitch fluoride, numeral 2 a boat provided with a resistance heater and made of tungsten or molybdenum, numeral 3 an infrared heater, numeral 4 a substrate for forming a film thereon, numeral 5 a rotating dome, numeral 6 a bell jar and numeral 7 a shutter. In operation, the temperature of the boat 2 is elevated by means of the resistance heater while evacuating the interior of the bell jar 6. The pitch fluoride decomposes and evaporates to deposit on the substrate 4. The temperature of the substrate 4 can be adjusted to room temperature to about 400° C. by means of the infrared heater. By the operation of the shutter 7, selective deposition of only certain components of the pitch fluoride which can evaporate at desired temperatures is possible.

Figure 35:
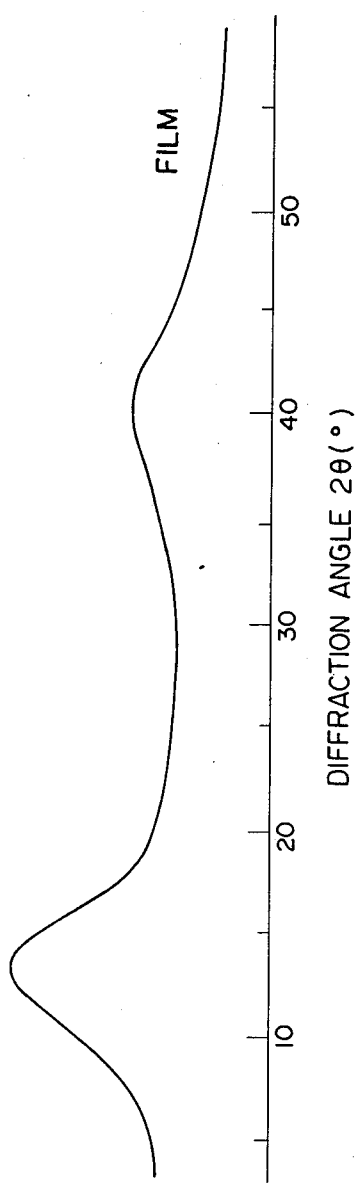
FIG. 35 shows the X-ray diffraction pattern of a film formed by vacuum deposition in Example 8 as will be mentioned later.

0.9 g of the pitch fluoride obtained in Example 2 was subjected to vacuum deposition at temperatures up to 600° C. in the above-mentioned apparatus evacuated to $5 \times 10^{-5}$ to $1 \times 10^{-4}$ mmHg. The substrate was an aluminum plate, which had been washed with acetone, and was maintained at about 200° C. There was obtained a thin film on the aluminum plate. The film had a thickness of 4000 Å and was uniform. The elementary analysis showed that the F/C ratio of the film was 1.22. The ESCA spectrum and IR spectrum of the film are shown in FIGS. 27 and 28, respectively. The X-ray diffraction pattern of the film is shown in FIG. 35. The contact angle of the film against water was 113±5° at 30° C.

The aluminum substrate carrying the film was taken out and placed in a nickel-made sealed type cylindrical vessel at its bottom, with the film side turned up. The vessel had, at its upper portion, a flange portion in which a fresh aluminum substrate was inserted so that one side of the substrate faced the film. The sealed vessel was evacuated to $5 \times 10^{-5}$ to $1 \times 10^{-4}$ mmHg. The bottom of the vessel was heated to 600° C. while maintaining the fresh substrate at room temperature. The film material was caused to evaporate and deposit on the fresh substrate to form a film thereon.

EXAMPLE 9

Figure 31:
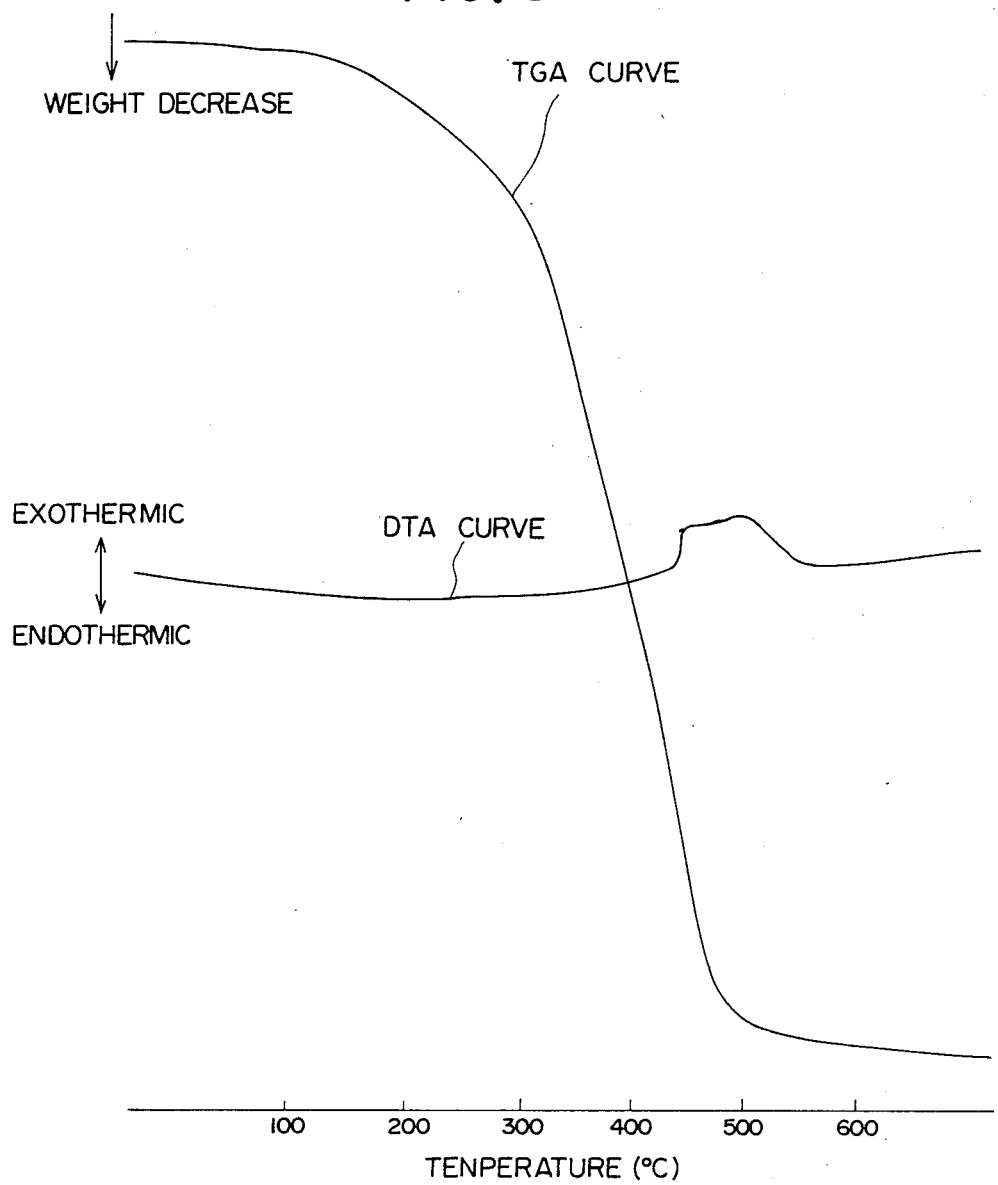
FIG. 31 shows the TGA and DTA curves of a pitch fluoride used for the formation of the film in Example 9.

Substantially the same procedures as described in Example 1 were repeated, except that the hydrogenated mesophase pitch was reacted with fluorine at 50° C. for 12 hours, to obtain a pitch fluoride. The TGA and DTA curves of the pitch fluoride are shown in FIG. 31.

In the same manner as in Example 8, the vacuum deposition was conducted, using 0.8 g of the pitch fluoride, at temperatures up to 600° C. under $7 \times 10^{-7}$ to $2 \times 10^{-6}$ mmHg. Aluminum, silicon, copper and nickel plates were separately used as substrates for forming a film thereon. The substrate was used after washing with acetone, and maintained at 200° C. during the vacuum deposition. There were obtained films each having a thickness of 2500 Å.

Figure 30:
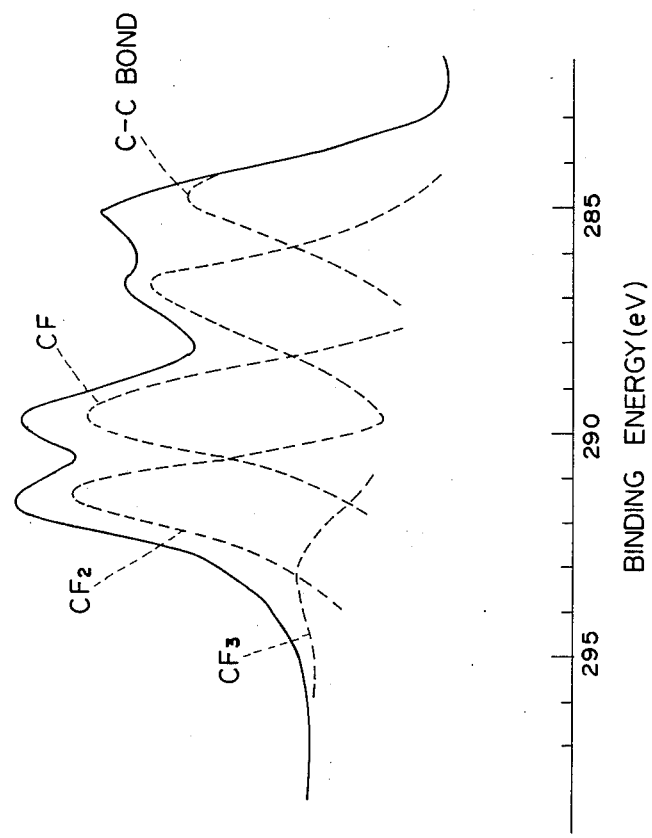
FIG. 30 shows the ESCA spectrum of a film formed by vacuum deposition in Example 9 as will be mentioned later.

With respect to the film formed on the copper plate, there is shown an ESCA spectrum in FIG. 30. With respect to the films formed on the other kinds of plates also, there were obtained similar ESCA spectra to that of FIG. 30. The F/C ratio of each of the films was 0.89.

The contact angles of the films against water (at 30° C.) were as follows.

| Kind of plate | Contact angle (°) |
|---|---|
| aluminum | 103.3 |
| silicon | 97.1 |
| copper | 100.7 |
| nickel | 98.8 |

In the same manner as in Example 8, the films were subjected to vacuum deposition. The film materials were caused to evaporate and deposit on fresh substrates to form films thereon.

EXAMPLE 10

Figure 33:
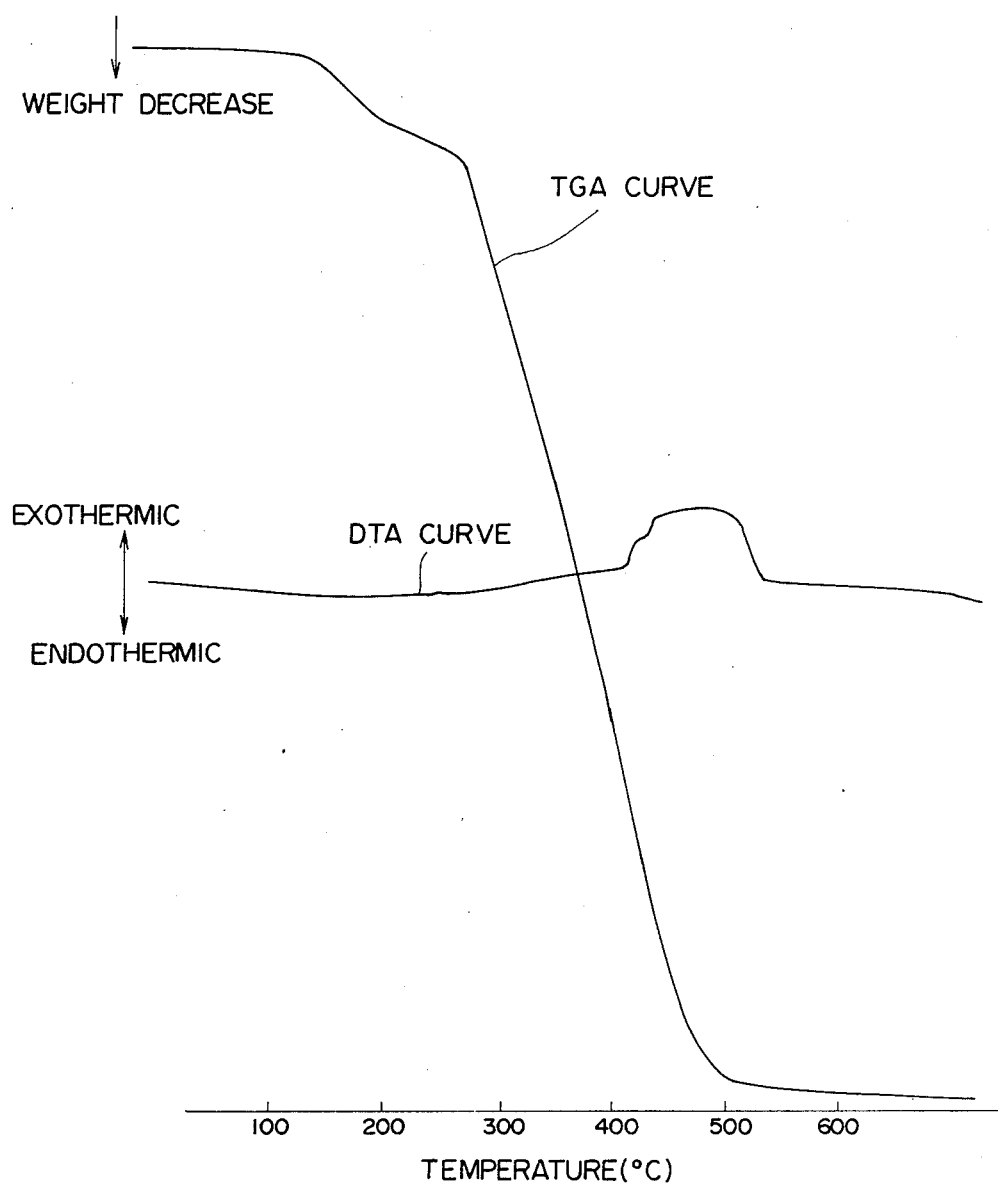
FIG. 33 shows the TGA and DTA curves of a pitch fluoride used for the formation of the film in Example 10.
Figure 34:
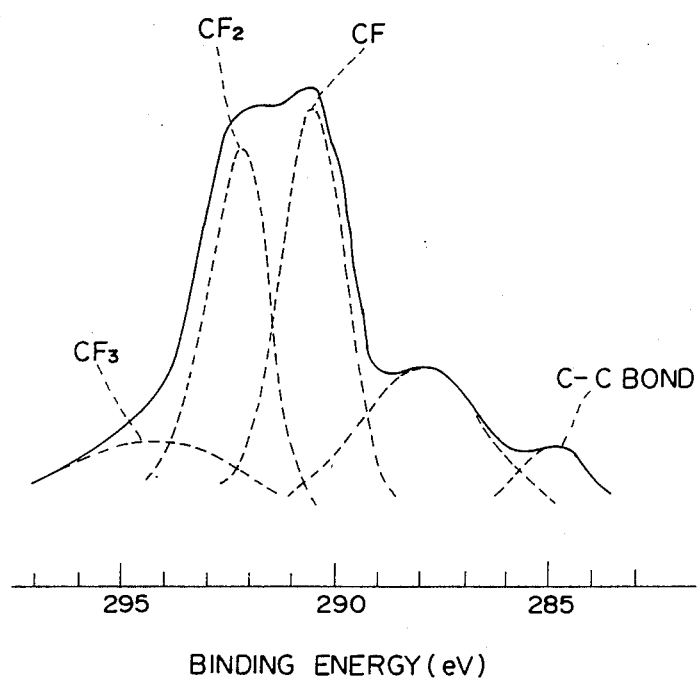
FIG. 34 shows the ESCA spectrum of a film formed by vacuum deposition in Example 11 as will be mentioned later.

Substantially the same procedures as described in Example 1 were repeated, except that the hydrogenated mesophase pitch was reacted with fluorine at 100° C. for 70 hours, to obtain a pitch fluoride. The TGA and DTA curves of the pitch fluoride are shown in FIG. 33.

In the same manner as in Example 8, the vacuum deposition was conducted, using 0.4 g of the pitch fluoride, at temperatures up to 600° C. under $1 \times 10^{-6}$ to $1.8 \times 10^{-6}$ mmHg. Aluminum, silicon, copper and nickel plates were separately used as substrates for forming a film thereon. The substrate was used after washing with acetone, and maintained at 250° C. during the vacuum deposition. There were obtained films each having a thickness of 1200 Å.

Figure 32:
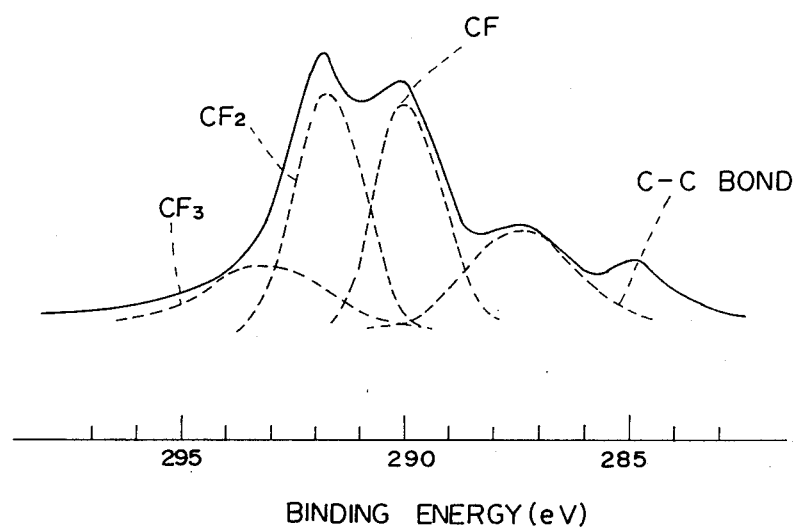
FIG. 32 shows the ESCA spectrum of a film formed by vacuum deposition in Example 10 as will be mentioned later.

With respect to the film formed on the copper plate, there is shown an ESCA spectrum in FIG. 32. With respect to the films formed on the other kinds of plates also, there were obtained similar ESCA spectra to that of FIG. 32. The F/C ratio of each of the films was 1.28.

The contact angles of the films against water (at 30° C.) were as follows.

| Kind of plate | Contact angle (°) |
|---|---|
| aluminum | 107.2 |
| silicon | 103.3 |
| copper | 106.8 |
| nickel | 104.2 |

In the same manner as in Example 8, the films were subjected to vacuum deposition. The film materials were caused to evaporate and deposit on fresh substrates to form films thereon.

EXAMPLE 11

0.3 g of the pitch fluoride obtained in Example 1 was charged in a nickel-made sealed type cylindrical vessel at its bottom. The vessel had a capacity of 500 ml. The interior of the vessel was filled with a nitrogen gas. The vessel was provided, at its upper portion, with a flange portion which was cooled by circulating water. The bottom of the vessel was heated to 600° C. to decompose the pitch fluoride. The resulting gaseous decomposition product deposited on and adhered to a portion around the flange portion. The deposited decomposition product was recovered, and subjected to vacuum deposition at temperatures up to 600° C. under $1.0 \times 10^{-6}$ to $2.0 \times 10^{-6}$ mmHg to produce a film on an aluminum plate in the same manner as in Example 8. The thickness of the film was 1500 Å. The contact angle of the film against water was 110°. The F/C ratio of the film was 1.15.

EXAMPLE 12

In substantially the same manner as in Example 8, 0.8 g of the pitch fluoride obtained in Example 1 was subjected to vacuum deposition at temperatures up to 200° C. under $5 \times 10^{-5}$ to $1.0 \times 10^{-4}$ mmHg. There was obtained a film on an aluminum plate. The thickness of the film was 500 Å. The contact angle of the film against water was 109°. The F/C ratio of the film was 1.10.

What is claimed is:

1. A pitch fluoride or mesocarbon microbeads fluoride comprising carbon atoms and fluorine atoms and having a structure in which layers containing fluorinated condensed cyclohexane rings are stacked to form a packing structure, the atomic ratio of fluorine to carbon atoms being 0.5 to 1.8, the pitch fluoride or meso carbon microbeads fluoride exhibiting:
   (a) in the powder X-ray diffraction pattern, a peak having a maximum intensity at about 13° ($2\theta$), a peak at about 40° ($2\theta$) having an intensity lower than that of the peak appearing at about 13° ($2\theta$) and no peak on the low side of diffraction angle relative to 13° ($2\theta$);
   (b) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;
   (c) a property that it is capable of forming a film by vacuum deposition; and
   (d) a contact angle of 141°±8° against water as measured at a temperature of 30° C.

2. A process for preparing a pitch fluoride or meso carbon microbeads fluoride comprising reacting a pitch or meso-carbon microbeads with fluorine.

3. The process according to claim 2, wherein the reaction is conducted at a temperature of about 0° to about 350° C.

4. A fluoro compound produced by the thermal decomposition of a pitch fluoride or meso carbon microbeads fluoride at about 250° to about 600° C. in an atmosphere of a member selected from the group consisting of air, a nitrogen gas and an inert gas, which exhibits:
   (e) a solid state at room temperature;
   (f) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;
   (g) a property that it is capable of forming a film by vacuum deposition; and
   (h) a contact angle of 105°±15° against water as measured at a temperature of 30° C. with respect to the fluoro compound which is in the form of a film, said pitch fluoride or meso carbon microbeads fluoride comprising carbon atoms and fluorine atoms and having a structure in which layers containing fluorinated condensed cyclohexane rings are stacked to form a packing structure, the atomic ratio of fluorine to carbon atoms being 0.5 to 1.8, the pitch fluoride or meso carbon microbeads fluoride exhibiting:
   (a) in the powder X-ray diffraction pattern, a peak having a maximum intensity at about 13° ($2\theta$), a peak at about 40° ($2\theta$) having an intensity lower than that of the peak appearing at about 13° ($2\theta$) and no peak on the low side of diffraction angle relative to 13° ($2\theta$);
   (b) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;
   (c) a property that it is capable of forming a film by vacuum deposition; and
   (d) a contact angle of 141°±8° against water as measured at a temperature of 30° C.

5. A film which is solid at room temperature, comprising carbon atoms and fluorine atoms and having a structure in which layers containing fluorinated condensed cyclohexane rings are stacked to form a packing structure, the atomic ratio of fluorine to carbon atoms being 0.5 to 1.8, the film exhibiting:
   (i) in the powder X-ray diffraction pattern, a peak having a maximum intensity at about 13° (20), a peak at about 40° (20) having an intensity lower than that of the peak appearing at about 13° (20) and no peak on the low side of diffraction angle relative to 13° (20);
   (ii) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5; and
   (iii) a property that when it is subjected to vacuum deposition, it evaporates and subsequently deposits on a substrate maintained at a temperature lower than the temperature employed for the vacuum deposition.

6. A film according to claim 5, which has a thickness of about $1 \times 10^2$ to about $1 \times 10^4$ Å.

7. A film produced by subjecting a pitch fluoride or meso carbon microbeads fluoride or a fluoro compound to vacuum deposition,
   said pitch fluoride or meso carbon microbeads fluoride comprising carbon atoms and fluorine atoms and having a structure in which layers containing fluorinated condensed cyclohexane rings are stacked to form a packing structure, the atomic ratio of fluorine to carbon atoms being 0.5 to 1.8, the carbon fluoride exhibiting:
   (a) in the powder X-ray diffraction pattern, a peak having a maximum intensity at about 13° ($2\theta$), a peak at about 40° ($2\theta$) having an intensity lower than that of the peak appearing at about 13° ($2\theta$) and no peak on the low side of diffraction angle relative to 13° ($2\theta$);
   (b) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;

(c) a property that it is capable of forming a film by vacuum deposition; and (d) a contact angle of 141°±8° against water as measured at a temperature of 30° C., said fluoro compound being a product produced by the thermal decomposition of a pitch fluoride or meso carbon microbeads fluoride at about 250° to about 600° C. in an atmosphere of a member selected from the group consisting of air, a nitrogen gas and an inert gas, which exhibits:

(e) a solid state at room temperature;

(f) in the spectrum of electron spectroscopy for chemical analysis, a peak due to a monofluorocarbon group at about 290.0±1.0 eV and a peak due to a difluorocarbon group at about 292.5±0.9 eV, the intensity ratio of the peak due to the difluorocarbon group to the peak due to the monofluorocarbon group being 0.15 to 1.5;

(g) a property that it is capable of forming a film by vacuum deposition; and (h) a contact angle of 105°±15° against water as measured at a temperature of 30° C. with respect to the fluoro compound which is in the form of a film.

8. The film according to claim 7, which is produced from said pitch fluoride or meso carbon microbeads fluoride and wherein said vacuum deposition is performed at a temperature of about 70° to about 600° C.

9. The film according to claim 7, which is produced from said fluoro compound and wherein said vacuum deposition is performed at a temperature of about 70° to 600° C.

* * * * *